(12) United States Patent
Volkerink et al.

(10) Patent No.: US 11,997,570 B1
(45) Date of Patent: May 28, 2024

(54) OPTIMIZED CONTEXT-BASED COMMUNICATIONS COMPRESSION FOR IOT SYSTEMS AND NETWORKS

(71) Applicant: Trackonomy Systems, Inc., San Jose, CA (US)

(72) Inventors: Hendrik J Volkerink, Palo Alto, CA (US); Ajay Khoche, West San Jose, CA (US)

(*) Notice: Subject to any disclaimer, the term of this patent is extended or adjusted under 35 U.S.C. 154(b) by 24 days.

(21) Appl. No.: 17/300,341

(22) Filed: May 14, 2021

Related U.S. Application Data

(60) Provisional application No. 63/025,165, filed on May 14, 2020.

(51) Int. Cl.
| | |
|---|---|
| *H03M 1/12* | (2006.01) |
| *H04W 4/38* | (2018.01) |
| *G06F 17/40* | (2006.01) |
| *H04B 7/0413* | (2017.01) |
| *H04W 56/00* | (2009.01) |
| *H04W 84/18* | (2009.01) |

(52) U.S. Cl.
CPC ............... *H04W 4/38* (2018.02); *H03M 1/12* (2013.01); *G06F 17/40* (2013.01); *H04B 7/0413* (2013.01); *H04W 56/0045* (2013.01); *H04W 84/18* (2013.01)

(58) Field of Classification Search
CPC ..... H03M 1/12; H04W 4/38; H04W 56/0045; H04W 84/18; H04B 7/0413
See application file for complete search history.

(56) References Cited

U.S. PATENT DOCUMENTS

| | | | |
|---|---|---|---|
| 7,061,879 | B2 | 6/2006 | Oprescu-Surcobe et al. |
| 8,738,945 | B2 | 5/2014 | Reed |
| 10,643,446 | B2 | 5/2020 | Kusen et al. |
| 2014/0037223 | A1 | 2/2014 | Jiang et al. |
| 2014/0089711 | A1 | 3/2014 | Balasundaram |
| 2014/0126346 | A1 | 5/2014 | Van Greunen et al. |
| 2017/0223653 | A1* | 8/2017 | Weitnauer ......... H04W 56/0045 |
| 2019/0059053 | A1 | 2/2019 | Qaderi et al. |

(Continued)

FOREIGN PATENT DOCUMENTS

WO     2019028269 A2     2/2019

OTHER PUBLICATIONS

PCT Application No. PCT/US201/053442, International Search Report and Written Opinion dated Jan. 14, 2022, 17 pages.

(Continued)

*Primary Examiner* — Joseph J Lauture

(57) ABSTRACT

A method is closed for context-based compression and reconstruction of data transmitted from a wireless node in an IOT system, according to some embodiments. The method includes a server receiving communications from a sender node. The communication includes truncated data comprising a sender node address, wherein the truncated data does not include an identifier of a physical premises associated with the sender node. The server accesses a lookup table comprising plurality of entries mapping sender node addresses to identifiers of physical premises. The server retrieves an identifier of a physical premises corresponding to node, according to the lookup table and appends the identifier of the physical premises to the sender address to reconstruct the full sender address.

19 Claims, 20 Drawing Sheets

(56) References Cited

U.S. PATENT DOCUMENTS

2019/0213857 A1    7/2019   Ghourchian et al.
2019/0243969 A1    8/2019   Birur
2019/0272458 A1    9/2019   Khoche
2020/0019779 A1    1/2020   Maeng et al.
2020/0019893 A1    1/2020   Lu

OTHER PUBLICATIONS

Almalkawai, I.T., et al., Wireless Multimedia Sensor Networks,: Current Trends and Future Directions. Sensors, 19(7): doi: 10.3390/s100706662, pp. 6682-6717, Jul. 9, 2010.

Kantarcioglu, Murat, UTD Cryptographic Hash Functions, undated.

* cited by examiner

OPTIMIZED CONTEXT-BASED COMMUNICATIONS COMPRESSION FOR IOT SYSTEMS AND NETWORKS

BACKGROUND

Wireless IOT devices may have limited battery power and resources available. It is desirable to maximize battery life and other sources of nodes in a wireless IOT system, while still maintaining the ability to perform specified tasks, such as sensing, detecting events, and communicating with other nodes. Data compression may be used to make conserve resources for an IoT system while communicating between nodes, but a high degree of data compression can have adverse effects on the ability for an IoT system to effectively detect events with high resolution in the communicated data.

SUMMARY

A method and system thereof for lossless compression, lossy compression, and lossy compression using contextual information is disclosed herein. The system comprises one or more wireless Internet of Things (IOT) device nodes and one or more servers, according to some embodiments. Dynamic compression is performed by the wireless IOT device nodes on the periphery. The wireless IOT nodes are configured with intelligence to perform the dynamic compression, determining which degree of compression or what type of compression should be applied to data before transmitting the data up to a server, cloud, or other node of the wireless IOT system.

The present disclosure describes a method and system thereof for context-based compression and reconstruction of data transmitted from a wireless node in an IOT system, according to some embodiments. The method includes a server receiving communications from a sender node. The sender node stores a full sender address which includes a sender address for the sender node and an identifier for a physical premises that is associated with the sender node. The communication includes truncated data comprising a sender node address, wherein the truncated data does not include an identifier of a physical premises associated with the sender node. The server accesses a lookup table comprising plurality of entries mapping sender node addresses to identifiers of physical premises. The server retrieves an identifier of a physical premises corresponding to node, according to the lookup table and appends the identifier of the physical premises to the sender address to reconstruct the full sender address.

The present disclosure also describes a method and system thereof for dynamic compression of analog data collected by a wireless node for communication in an IOT system, according to some embodiments. The method includes capturing, at a sender node, an analog data set describing a continuous variable. The sender node generates one or more statistics describing the analog data set. The sender node then converts the analog data set to digital data, using dynamic compression. The sender node selects a conversion equation based at least in part on the statistics describing the analog data set. The conversion equation may describe how the digital data represents the analog data. The conversion equation may correspond to an equation for reconstructing the analog data from the digital data, once the data is received at a server or another node of the wireless IOT system. The conversion equation may be selected based further on environmental conditions of the sender node, a known location of the sender node, a region of interest in the data, an application for the data, or some other factors. The sender node applies the selected conversion equation to convert the analog data set to a digital data set. The sender node then transmits converted digital data and one or more statistics to a server or another node of the wireless IOT system. The recipient of the transmitted data may then reconstruct the data using dynamic reconstruction of the data. The reconstruction may be based on the selected conversion equation. In some embodiments, the sender node transmits an identifier for the selected conversion equation along with the compressed data. In other embodiments, the recipient is configured to determine the selected conversion equation based on contextual information.

By distributing intelligence and decision making on the dynamic compression for data communications to the wireless device nodes on the periphery of the wireless IOT system hierarchy, the wireless device nodes are able to conserve resources required for performing wireless communications, such as battery power and communication bandwidth. By dynamically adjusting the degree and type of compression applied to data, the disclosed system is able to conserve communication resources, while maintaining a high specificity or resolution for determining the occurrence of events based on the data. Using context-based reconstruction of the compressed data also allows for the minimizing of loss of critical information for detecting events and conditions in the data captured by the wireless device nodes.

Embodiments of the subject matter described in this specification include methods, processes, systems, apparatus, and tangible non-transitory carrier media encoded with one or more program instructions for carrying out one or more methods and processes for enabling the various functionalities of the described systems and apparatus.

Other features, aspects, objects, and advantages of the subject matter described in this specification will become apparent from the description, the drawings, and the claims.

DETAILED DESCRIPTION

Figure 1A:
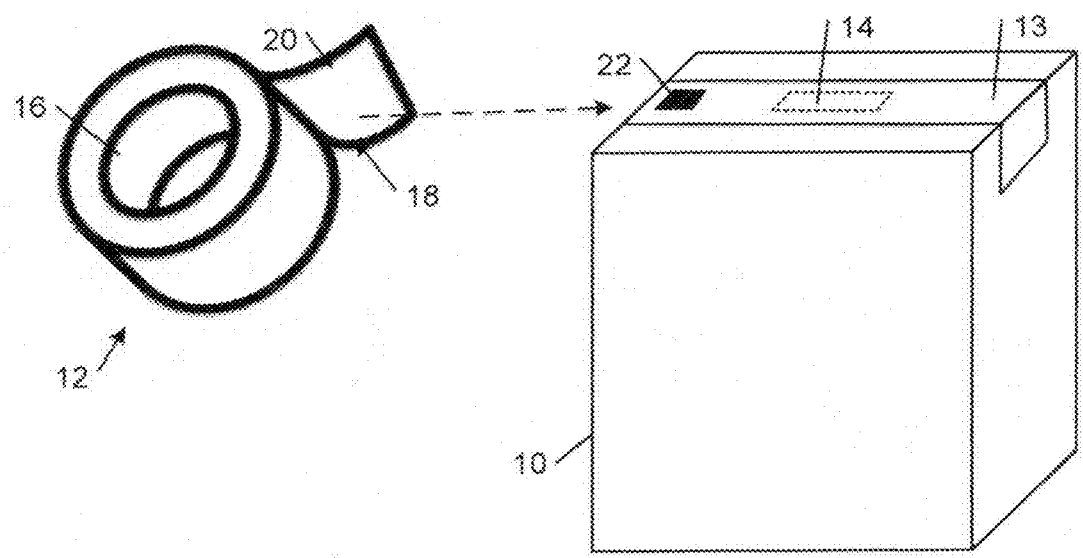
FIG. 1A is a diagrammatic view of an asset that has been sealed for shipment using a segment of an example adhesive tape platform dispensed from a roll, according to some embodiments.

Disclosed herein is a method and system thereof for dynamic, context-based data compression for optimizing communication between wireless nodes in a wireless IOT system. The disclosed method and system allow for selectively compressing data to different degrees of compression based on a required specificity or accuracy of received data. Using the disclosed method and system conserves communication resources such as battery power and communication bandwidth, while minimizing the adverse effects that increased information loss can have on industrial IOT applications. In some embodiments, the disclosed method and system minimize the loss of "critical" data, where the loss of critical data impedes the ability for the wireless IOT system to resolve events and perform actions.

In some embodiments, a wireless node is a wireless communication device that is an adhesive tape platform or a segment thereof. The adhesive tape platform includes wireless transducing components and circuitry that perform communication and/or sensing. The adhesive tape platform has a flexible adhesive tape form-factor that allows it to function as both an adhesive tape for adhering to and/or sealing objects and a wireless sensing device.

In the following description, like reference numbers are used to identify like elements. Furthermore, the drawings are intended to illustrate major features of exemplary embodiments in a diagrammatic manner. The drawings are not intended to depict every feature of actual embodiments nor relative dimensions of the depicted elements and are not drawn to scale.

As used herein, the term "or" refers to an inclusive "or" rather than an exclusive "or." In addition, the articles "a" and "an" as used in the specification and claims mean "one or more" unless specified otherwise or clear from the context to refer the singular form.

The term "tape node" refers to an adhesive tape platform or a segment thereof that is equipped with sensor, processor, memory, energy source/harvesting mechanism, and wireless communications functionality, where the adhesive tape platform (also referred to herein as an "adhesive product" or an "adhesive tape product") has a variety of different form factors, including a multilayer roll or a sheet that includes a plurality of divisible adhesive segments. Once deployed, each tape node can function, for example, as an adhesive tape, label, sticker, decal, or the like, and as a wireless communications device.

The terms "adhesive tape node," "wireless node," or "tape node" may be used interchangeably in certain contexts, and refer to an adhesive tape platform or a segment thereof that is equipped with sensor, processor, memory, energy source/harvesting mechanism, and wireless communications functionality, where the adhesive product has a variety of different form factors, including a multilayer roll or a sheet that includes a plurality of divisible adhesive segments. Once deployed, each tape node or wireless node can function, for example, as an adhesive tape, label, sticker, decal, or the like, and as a wireless communications device. A "peripheral" tape node or wireless node, also referred to as an outer node, leaf node, or terminal node, refers to a node that does not have any child nodes.

In certain contexts, the terms "parcel," "envelope," "box," "package," "container," "pallet," "carton," "wrapping," and the like are used interchangeably herein to refer to a packaged item or items.

In certain contexts, the terms "wireless tracking system," "hierarchical communications network," "distributed agent operating system," and the like are used interchangeably herein to refer to a system or network of wireless nodes.

Introduction

This specification describes a low-cost, multi-function adhesive tape platform with a form factor that unobtrusively integrates the components useful for implementing a combination of different asset tracking and management functions and also is able to perform a useful ancillary function that otherwise would have to be performed with the attendant need for additional materials, labor, and expense. In an aspect, the adhesive tape platform is implemented as a collection of adhesive products that integrate wireless communications and sensing components within a flexible adhesive structure in a way that not only provides a cost-effective platform for interconnecting, optimizing, and protecting the components of the tracking system but also maintains the flexibility needed to function as an adhesive product that can be deployed seamlessly and unobtrusively into various asset management and tracking applications and workflows, including person and object tracking applications, and asset management workflows such as manufacturing, storage, shipping, delivery, and other logistics associated with moving products and other physical objects, including logistics, sensing, tracking, locationing, warehousing, parking, safety, construction, event detection, road management and infrastructure, security, and healthcare. In some examples, the adhesive tape platforms are used in various aspects of asset management, including sealing assets, transporting assets, tracking assets, monitoring the conditions of assets, inventorying assets, and verifying asset security. In these examples, the assets typically are transported from one location to another by truck, train, ship, or aircraft or within premises, e.g., warehouses by forklift, trolleys etc.

In disclosed examples, an adhesive tape platform includes a plurality of segments that can be separated from the adhesive product (e.g., by cutting, tearing, peeling, or the like) and adhesively attached to a variety of different surfaces to inconspicuously implement any of a wide variety of different wireless communications based network communications and transducing (e.g., sensing, actuating, etc.) applications. Examples of such applications include: event detection applications, monitoring applications, security applications, notification applications, and tracking applications, including inventory tracking, asset tracking, person tracking, animal (e.g., pet) tracking, manufactured parts tracking, and vehicle tracking. In example embodiments, each segment of an adhesive tape platform is equipped with an energy source, wireless communication functionality, transducing functionality, and processing functionality that enable the segment to perform one or more transducing functions and report the results to a remote server or other computer system directly or through a network of tapes. The components of the adhesive tape platform are encapsulated within a flexible adhesive structure that protects the components from damage while maintaining the flexibility needed to function as an adhesive tape (e.g., duct tape or a label) for use in various applications and workflows. In addition to single function applications, example embodiments also include multiple transducers (e.g., sensing and/or actuating transducers) that extend the utility of the platform by, for example, providing supplemental information and functionality relating characteristics of the state and or environment of, for example, an article, object, vehicle, or person, over time.

Systems and processes for fabricating flexible multifunction adhesive tape platforms in efficient and low-cost ways also are described. In addition to using roll-to-roll and/or sheet-to-sheet manufacturing techniques, the fabrication systems and processes are configured to optimize the placement and integration of components within the flexible adhesive structure to achieve high flexibility and ruggedness. These fabrication systems and processes are able to create useful and reliable adhesive tape platforms that can provide local sensing, wireless transmitting, and locationing functionalities. Such functionality together with the low cost of production is expected to encourage the ubiquitous deployment of adhesive tape platform segments and thereby alleviate at least some of the problems arising from gaps in conventional infrastructure coverage that prevent continuous monitoring, event detection, security, tracking, and other asset tracking and management applications across heterogeneous environments.

Adhesive Tape Platform

FIG. 1A shows an example asset 10 that is sealed for shipment using an example adhesive tape platform 12 that includes embedded components of a wireless transducing circuit 14 (collectively referred to herein as a "tape node"). In this example, a length 13 of the adhesive tape platform 12 is dispensed from a roll 16 and affixed to the asset 10. The adhesive tape platform 12 includes an adhesive side 18 and a non-adhesive side 20. The adhesive tape platform 12 can be dispensed from the roll 16 in the same way as any conventional packing tape, shipping tape, or duct tape. For example, the adhesive tape platform 12 may be dispensed from the roll 16 by hand, laid across the seam where the two top flaps of the asset 10 meet, and cut to a suitable length either by hand or using a cutting instrument (e.g., scissors or an automated or manual tape dispenser). Examples of such tapes include tapes having non-adhesive sides 20 that carry one or more coatings or layers (e.g., colored, light reflective, light absorbing, and/or light emitting coatings or layers).

Figure 1B:
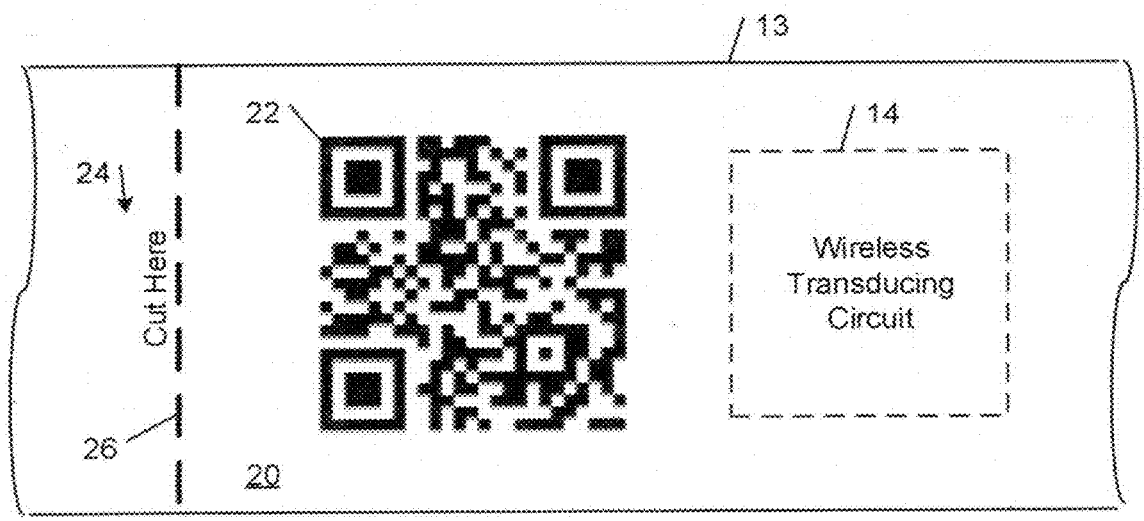
FIG. 1B is a diagrammatic top view of a portion of the segment of the example adhesive tape platform shown in FIG. 1A, according to some embodiments.

Referring to FIG. 1B, in some examples, the non-adhesive side 20 of the length 13 of the adhesive tape platform 12 includes writing or other markings that convey instructions, warnings, or other information to a person or machine (e.g., a bar code reader), or may simply be decorative and/or entertaining. For example, different types of adhesive tape platforms may be marked with distinctive colorations to distinguish one type of adhesive tape platform from another. In the illustrated example, the length 13 of the adhesive tape platform 12 includes a two-dimensional bar code (e.g., a QR Code) 22, written instructions 24 (i.e., "Cut Here"), and an associated cut line 26 that indicates where the user should cut the adhesive tape platform 12. The written instructions 24 and the cut line 26 typically are printed or otherwise marked on the top non-adhesive surface 20 of the adhesive tape platform 12 during manufacture. The two-dimensional bar code 22, on the other hand, may be marked on the non-adhesive surface 20 of the adhesive tape platform 12 during the manufacture of the adhesive product 12 or, alternatively, may be marked on the non-adhesive surface 20 of the adhesive tape platform 12 as needed using, for example, a printer or other marking device.

In order to avoid damage to the functionality of the segments of the adhesive tape platform 12, the cut lines 26 typically demarcate the boundaries between adjacent segments at locations that are free of any active components of the wireless transducing circuit 14. The spacing between the wireless transducing circuit components 14 and the cut lines 26 may vary depending on the intended communication, transducing and/or adhesive taping application. In the example illustrated in FIG. 1A, the length of the adhesive tape platform 12 that is dispensed to seal the asset 10 corresponds to a single segment of the adhesive tape platform 12. In other examples, the length of the adhesive tape platform 12 needed to seal a asset or otherwise serve the adhesive function for which the adhesive tape platform 12 is being applied may include multiple segments 13 of the adhesive tape platform 12, one or more of which segments 13 may be activated upon cutting the length of the adhesive tape platform 12 from the roll 16 and/or applying the length of the adhesive tape platform to the asset 10.

In some examples, the transducing components 14 that are embedded in one or more segments 13 of the adhesive tape platform 12 are activated when the adhesive tape platform 12 is cut along the cut line 26. In these examples, the adhesive tape platform 12 includes one or more embedded energy sources (e.g., thin film batteries, which may be printed, or conventional cell batteries, such as conventional watch style batteries, rechargeable batteries, or other energy storage device, such as a super capacitor or charge pump) that supply power to the transducing components 14 in one or more segments of the adhesive tape platform 12 in response to being separated from the adhesive tape platform 12 (e.g., along the cut line 26).

In some examples, each segment 13 of the adhesive tape platform 12 includes its own respective energy source including energy harvesting elements that can harvest energy from the environment. In some of these examples, each energy source is configured to only supply power to the components in its respective adhesive tape platform segment regardless of the number of contiguous segments 13 that are in a given length of the adhesive tape platform 12. In other examples, when a given length of the adhesive tape platform 12 includes multiple segments 13, the energy sources in the respective segments 13 are configured to supply power to the transducing components 14 in all of the segments 13 in the given length of the adhesive tape platform 12. In some of these examples, the energy sources are connected in parallel and concurrently activated to power the transducing components 14 in all of the segments 13 at the same time. In other examples, the energy sources are connected in parallel and alternately activated to power the transducing components 14 in respective ones of the adhesive tape platform segments 13 at different time periods, which may or may not overlap.

Figure 2:
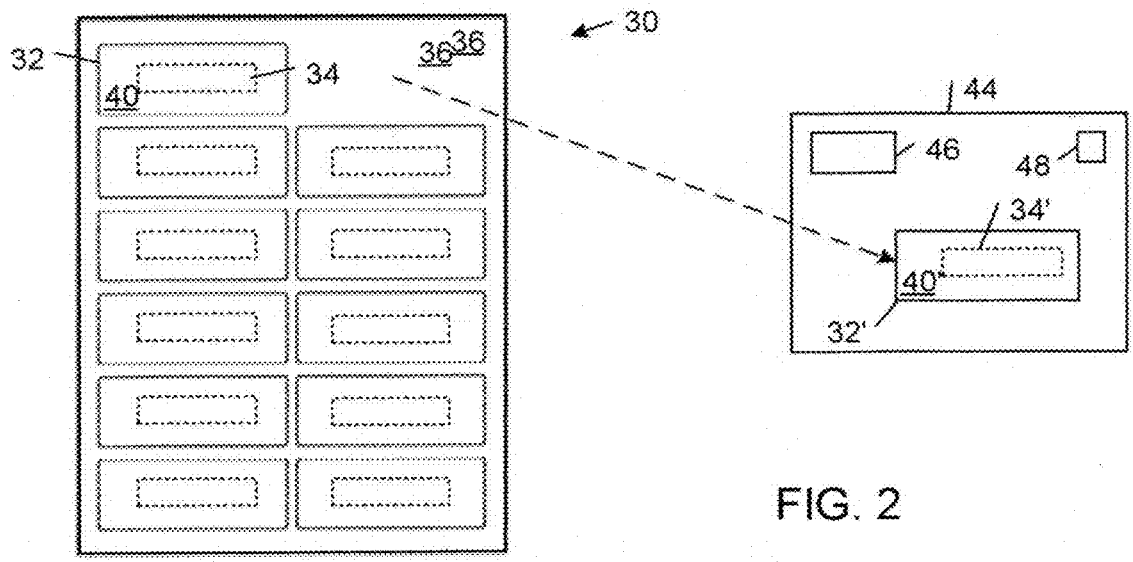
FIG. 2 is a diagrammatic view of an example of an envelope carrying a segment of an example adhesive tape platform dispensed from a backing sheet, according to some embodiments.

FIG. 2 shows an example adhesive tape platform 30 that includes a set of adhesive tape platform segments 32 each of which includes a respective set of embedded wireless transducing circuit components 34, and a backing sheet 36 with a release coating that prevents the adhesive segments 32 from adhering strongly to the backing sheet 36. Each adhesive tape platform segment 32 includes an adhesive side facing the backing sheet 36, and an opposing non-adhesive side 40. In this example, a particular segment 32' of the adhesive tape platform 30 has been removed from the backing sheet 36 and affixed to an envelope 44. Each segment 32 of the adhesive tape platform 30 can be removed from the backing sheet 36 in the same way that adhesive labels can be removed from a conventional sheet of adhesive labels (e.g., by manually peeling a segment 32 from the backing sheet 36). In general, the non-adhesive side 40' of the segment 32' may include any type of writing, markings, decorative designs, or other ornamentation. In the illustrated example, the non-adhesive side 40' of the segment 32' includes writing or other markings that correspond to a destination address for the envelope 44. The envelope 44 also includes a return address 46 and, optionally, a postage stamp or mark 48.

In some examples, segments of the adhesive tape platform 12 are deployed by a human operator. The human operator may be equipped with a mobile phone or other device that allows the operator to authenticate and initialize the adhesive tape platform 12. In addition, the operator can take a picture of a asset including the adhesive tape platform and any barcodes associated with the asset and, thereby, create a persistent record that links the adhesive tape platform 12 to the asset. In addition, the human operator typically will send the picture to a network service and/or transmit the picture to the adhesive tape platform 12 for storage in a memory component of the adhesive tape platform 12.

In some examples, the wireless transducing circuit components 34 that are embedded in a segment 32 of the adhesive tape platform 12 are activated when the segment 32 is removed from the backing sheet 32. In some of these examples, each segment 32 includes an embedded capacitive sensing system that can sense a change in capacitance when the segment 32 is removed from the backing sheet 36. As explained in detail below, a segment 32 of the adhesive tape platform 30 includes one or more embedded energy sources (e.g., thin film batteries, common disk-shaped cell batteries, or rechargeable batteries or other energy storage devices, such as a super capacitor or charge pump) that can be configured to supply power to the wireless transducing circuit components 34 in the segment 32 in response to the detection of a change in capacitance between the segment 32 and the backing sheet 36 as a result of removing the segment 32 from the backing sheet 36.

Figure 3:
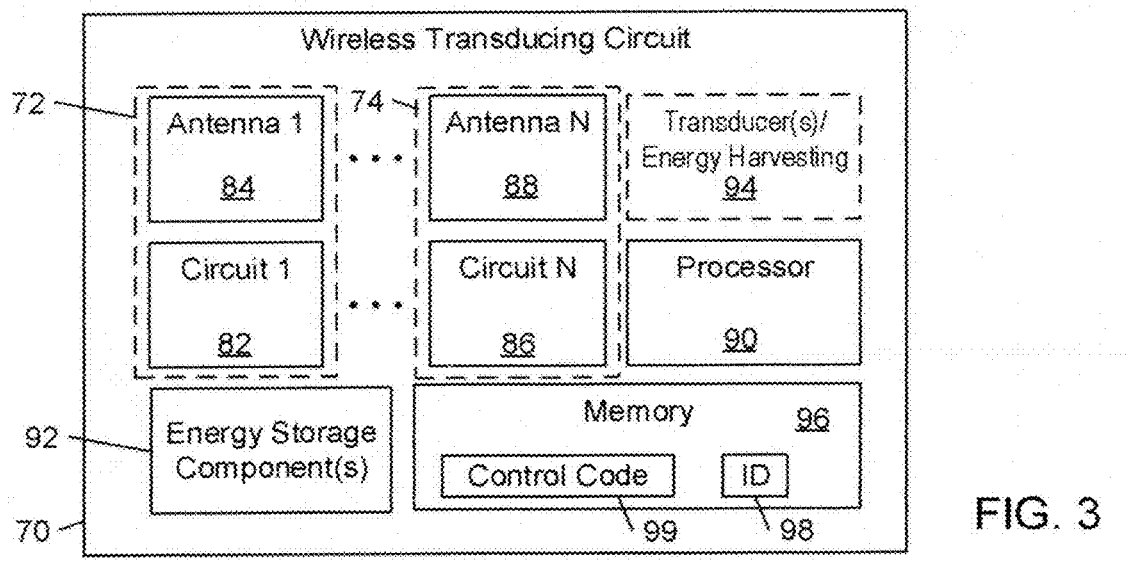
FIG. 3 is a schematic view of an example segment of an adhesive tape platform, according to some embodiments.

FIG. 3 shows a block diagram of the components of an example wireless transducing circuit 70 that includes a number of communication systems 72, 74. Example communication systems 72, 74 include a GPS system that includes a GPS receiver circuit 82 (e.g., a receiver integrated circuit) and a GPS antenna 84, and one or more wireless communication systems each of which includes a respective transceiver circuit 86 (e.g., a transceiver integrated circuit) and a respective antenna 88. Example wireless communication systems include a cellular communication system (e.g., GSM/GPRS), a Wi-Fi communication system, an RF communication system (e.g., LoRa), a Bluetooth communication system (e.g., a Bluetooth Low Energy system), a Z-wave communication system, and a ZigBee communication system. The wireless transducing circuit 70 also includes a processor 90 (e.g., a microcontroller or microprocessor), one or more energy storage devices 92 (e.g., non-rechargeable or rechargeable printed flexible battery, conventional single or multiple cell battery, and/or a super capacitor or charge pump), one or more transducers 94 (e.g., sensors and/or actuators, and, optionally, one or more energy harvesting transducer components). In some examples, the conventional single or multiple cell battery may be a watch style disk or button cell battery that is associated electrical connection apparatus (e.g., a metal clip) that electrically connects the electrodes of the battery to contact pads on the flexible circuit 116.

Examples of sensing transducers 94 include a capacitive sensor, an altimeter, a gyroscope, an accelerometer, a temperature sensor, a strain sensor, a pressure sensor, a piezoelectric sensor, a weight sensor, an optical or light sensor (e.g., a photodiode or a camera), an acoustic or sound sensor (e.g., a microphone), a smoke detector, a radioactivity sensor, a chemical sensor (e.g., an explosives detector), a biosensor (e.g., a blood glucose biosensor, odor detectors, antibody based pathogen, food, and water contaminant and toxin detectors, DNA detectors, microbial detectors, pregnancy detectors, and ozone detectors), a magnetic sensor, an electromagnetic field sensor, and a humidity sensor. Examples of actuating (e.g., energy emitting) transducers 94 include light emitting components (e.g., light emitting diodes and displays), electro-acoustic transducers (e.g., audio speakers), electric motors, and thermal radiators (e.g., an electrical resistor or a thermoelectric cooler).

In some examples, the wireless transducing circuit 70 includes a memory 96 for storing data, including, e.g., profile data, state data, event data, sensor data, localisation data, security data, and one or more unique identifiers (ID) 98 associated with the wireless transducing circuit 70, such as a product ID, a type ID, and a media access control (MAC) ID, and control code 99. In some examples, the memory 96 may be incorporated into one or more of the processor 90 or transducers 94, or may be a separate component that is integrated in the wireless transducing circuit 70 as shown in FIG. 3. The control code typically is implemented as programmatic functions or program modules that control the operation of the wireless transducing circuit 70, including a tape node communication manager that manages the manner and timing of tape node communications, a tape node power manager that manages power consumption, and a tape node connection manager that controls whether connections with other tape nodes are secure connections or unsecure connections, and a tape node storage manager that securely manages the local data storage on the node. The tape node connection manager ensures the level of security required by the end application and supports various encryption mechanisms. The tape node power manager and tape communication manager work together to optimize the battery consumption for data communication. In some examples, execution of the control code by the different types of tape nodes described herein may result in the performance of similar or different functions.

Figure 4:
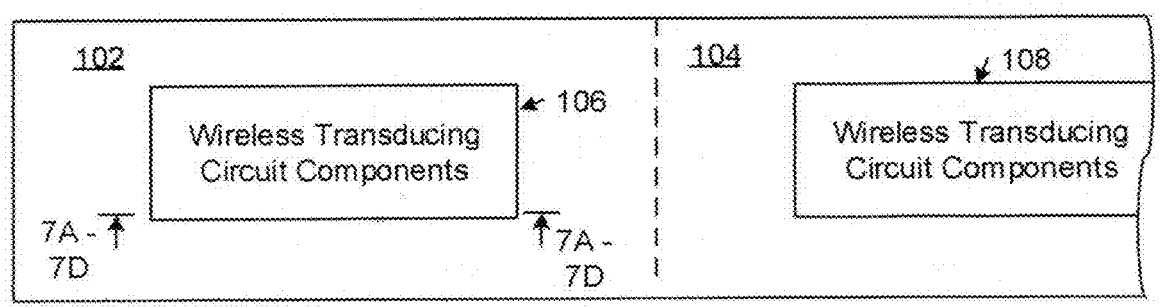
FIG. 4 is a diagrammatic top view of a length of an example adhesive tape platform, according to some embodiments.

FIG. 4 is a top view of a portion of an example flexible adhesive tape platform 100 that shows a first segment 102 and a portion of a second segment 104. Each segment 102, 104 of the flexible adhesive tape platform 100 includes a respective set 106, 108 of the components of the wireless transducing circuit 70. The segments 102, 104 and their respective sets of components 106, 108 typically are identical and configured in the same way. In some other embodiments, however, the segments 102, 104 and/or their respective sets of components 106, 108 are different and/or configured in different ways. For example, in some examples, different sets of the segments of the flexible adhesive tape platform 100 have different sets or configurations of tracking and/or transducing components that are designed and/or optimized for different applications, or different sets of segments of the flexible adhesive tape platform may have different ornamentations (e.g., markings on the exterior surface of the platform) and/or different (e.g., alternating) lengths.

An example method of fabricating the adhesive tape platform 100 (see FIG. 4) according to a roll-to-roll fabrication process is described in connection with FIGS. 6, 7A, and 7B of U.S. Pat. No. 10,262,255, issued Apr. 16, 2019, the entirety of which is incorporated herein by reference.

The instant specification describes an example system of adhesive tape platforms (also referred to herein as "tape nodes") that can be used to implement a low-cost wireless network infrastructure for performing monitoring, tracking, and other asset management functions relating to, for example, parcels, persons, tools, equipment and other physical assets and objects. The example system includes a set of three different types of tape nodes that have different respective functionalities and different respective cover markings that visually distinguish the different tape node types from one another. In one non-limiting example, the covers of the different tape node types are marked with different colors (e.g., white, green, and black). In the illustrated examples, the different tape node types are distinguishable from one another by their respective wireless communications capabilities and their respective sensing capabilities.

Figure 5A:
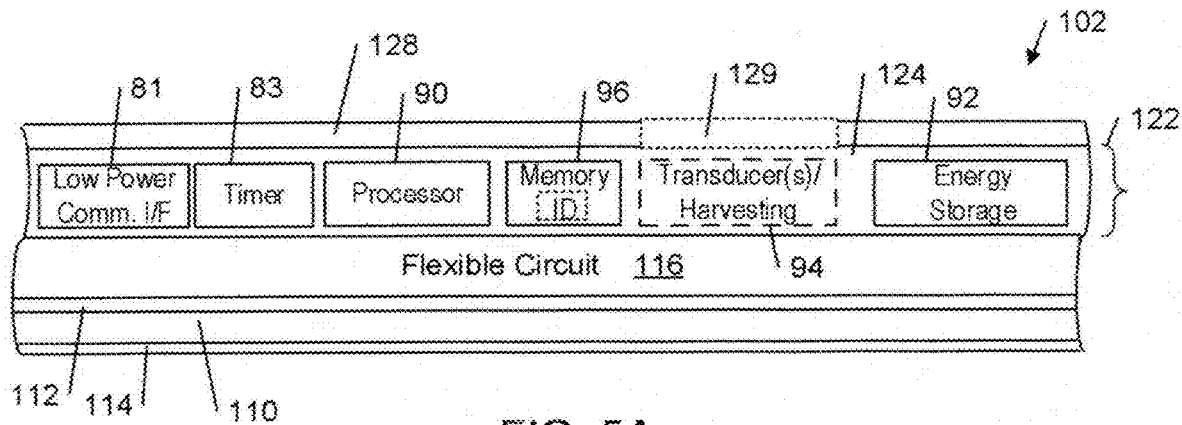
FIGS. 5A-5C show diagrammatic cross-sectional side views of portions of different respective adhesive tape platforms, according to some embodiments.

FIG. 5A shows a cross-sectional side view of a portion of an example segment 102 of the flexible adhesive tape platform 100 that includes a respective set of the components of the wireless transducing circuit 106 corresponding to the first tape node type (i.e., white). The flexible adhesive tape platform segment 102 includes an adhesive layer 112, an optional flexible substrate 110, and an optional adhesive layer 114 on the bottom surface of the flexible substrate 110. If the bottom adhesive layer 114 is present, a release liner (not shown) may be (weakly) adhered to the bottom surface of the adhesive layer 114. In some examples, the adhesive layer 114 includes an adhesive (e.g., an acrylic foam adhesive) that has a high bond strength that is sufficient to prevent removal of the adhesive segment 102 from a surface on which the adhesive layer 114 is adhered without destroying the physical or mechanical integrity of the adhesive segment 102 and/or one or more of its constituent components. In some examples, the optional flexible substrate 110 is implemented as a prefabricated adhesive tape that includes the adhesive layers 112, 114 and the optional release liner. In other examples, the adhesive layers 112, 114 are applied to the top and bottom surfaces of the flexible substrate 110 during the fabrication of the adhesive tape platform 100. The adhesive layer 112 bonds the flexible substrate 110 to a bottom surface of a flexible circuit 116, that includes one or more wiring layers (not shown) that connect the processor 90, a low power wireless communication interface 81 (e.g., a Zigbee, Bluetooth® Low Energy (BLE) interface, or other low power communication interface), a timer circuit 83, transducing and/or energy harvesting component(s) 94 (if present), the memory 96, and other components in a device layer 122 to each other and to the energy storage component 92 and, thereby, enable the transducing, tracking and other functionalities of the flexible adhesive tape platform segment 102. The low power wireless communication interface 81 typically includes one or more of the antennas 84, 88 and one or more of the wireless circuits 82, 86.

Figure 5B:
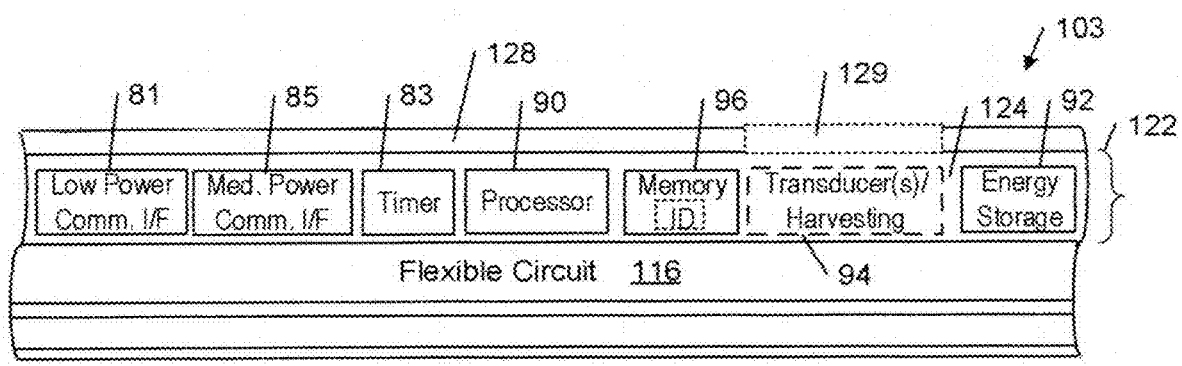

FIG. 5B shows a cross-sectional side view of a portion of an example segment 103 of the flexible adhesive tape platform 100 that includes a respective set of the components of the wireless transducing circuit 106 corresponding to the second tape node type (i.e., green). In this example, the flexible adhesive tape platform segment 103 differs from the segment 102 shown in FIG. 5A by the inclusion of a medium power communication interface 85 (e.g., a LoRa interface) in addition to the low power communications interface that is present in the first tape node type (i.e., white). The medium power communication interface has longer communication range than the low power communication interface. In some examples, one or more other components of the flexible adhesive tape platform segment 103 differ, for example, in functionality or capacity (e.g., larger energy source).

Figure 5C:
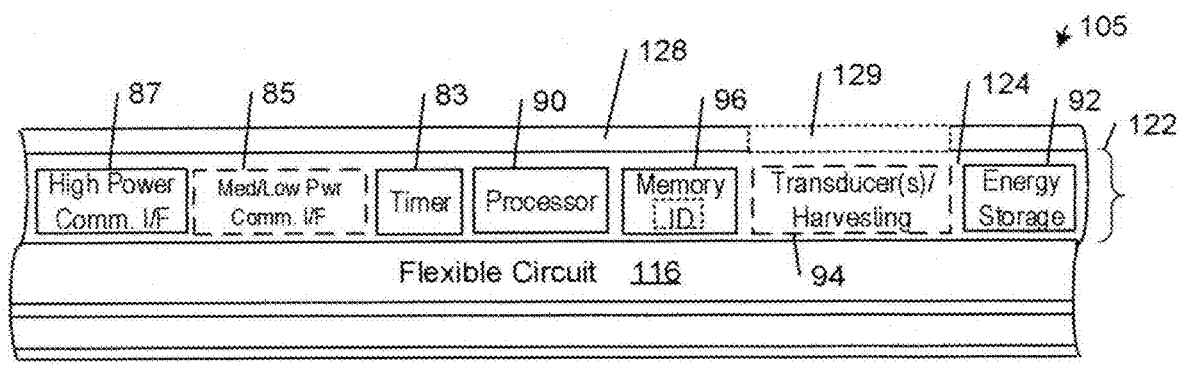

FIG. 5C shows a cross-sectional side view of a portion of an example segment 105 of the flexible adhesive tape platform 100 that includes a respective set of the components of the wireless transducing circuit 106 corresponding to the third tape node type (i.e., black). In this example, the flexible adhesive tape platform segment 105 includes a high power communications interface 87 (e.g., a cellular interface; e.g., GSM/GPRS) and an optional medium and/or low power communications interface 85. The high power communication range provides global coverage to available infrastructure (e.g. the cellular network). In some examples, one or more other components of the flexible adhesive tape platform segment 105 differ, for example, in functionality or capacity (e.g., larger energy source).

FIGS. 5A-5C show examples in which the cover layer 128 of the flexible adhesive tape platform 100 includes one or more interfacial regions 129 positioned over one or more of the transducers 94. In examples, one or more of the interfacial regions 129 have features, properties, compositions, dimensions, and/or characteristics that are designed to improve the operating performance of the platform 100 for specific applications. In some examples, the flexible adhesive tape platform 100 includes multiple interfacial regions 129 over respective transducers 94, which may be the same or different depending on the target applications. Example interfacial regions include an opening, an optically transparent window, and/or a membrane located in the interfacial region 129 of the cover 128 that is positioned over the one or more transducers and/or energy harvesting components 94. Additional details regarding the structure and operation of example interfacial regions 129 are described in U.S. Provisional Patent Application No. 62/680,716, filed Jun. 5, 2018, PCT Patent Application No. PCT/US2018/064919, filed Dec. 11, 2018, U.S. Pat. No. 10,885,420, issued Jan. 4, 2021, U.S. Pat. No. 10,902,310 issued Jan. 25, 2021, and U.S. Provisional Patent Application No. 62/670,712, filed May 11, 2018, all of which are incorporated herein in their entirety.

In some examples, a flexible polymer layer 124 encapsulates the device layer 122 and thereby reduces the risk of damage that may result from the intrusion of contaminants and/or liquids (e.g., water) into the device layer 122. The flexible polymer layer 124 also planarizes the device layer 122. This facilitates optional stacking of additional layers on the device layer 122 and also distributes forces generated in, on, or across the adhesive tape platform segment 102 so as to reduce potentially damaging asymmetric stresses that might be caused by the application of bending, torqueing, pressing, or other forces that may be applied to the flexible adhesive tape platform segment 102 during use. In the illustrated example, a flexible cover 128 is bonded to the planarizing polymer 124 by an adhesive layer (not shown).

The flexible cover 128 and the flexible substrate 110 may have the same or different compositions depending on the intended application. In some examples, one or both of the flexible cover 128 and the flexible substrate 110 include flexible film layers and/or paper substrates, where the film layers may have reflective surfaces or reflective surface coatings. Example compositions for the flexible film layers include polymer films, such as polyester, polyimide, polyethylene terephthalate (PET), and other plastics. The optional adhesive layer on the bottom surface of the flexible cover 128 and the adhesive layers 112, 114 on the top and bottom surfaces of the flexible substrate 110 typically include a pressure-sensitive adhesive (e.g., a silicon-based adhesive). In some examples, the adhesive layers are applied to the flexible cover 128 and the flexible substrate 110 during manufacture of the adhesive tape platform 100 (e.g., during a roll-to-roll or sheet-to-sheet fabrication process). In other examples, the flexible cover 128 may be implemented by a prefabricated single-sided pressure-sensitive adhesive tape and the flexible substrate 110 may be implemented by a prefabricated double-sided pressure-sensitive adhesive tape; both kinds of tape may be readily incorporated into a roll-to-roll or sheet-to-sheet fabrication process. In some examples, the flexible polymer layer 124 is composed of a flexible epoxy (e.g., silicone).

In some examples, the energy storage device 92 is a flexible battery that includes a printed electrochemical cell, which includes a planar arrangement of an anode and a cathode and battery contact pads. In some examples, the flexible battery may include lithium-ion cells or nickel-cadmium electro-chemical cells. The flexible battery typically is formed by a process that includes printing or laminating the electro-chemical cells on a flexible substrate (e.g., a polymer film layer). In some examples, other components may be integrated on the same substrate as the flexible battery. For example, the low power wireless communication interface 81 and/or the processor(s) 90 may be integrated on the flexible battery substrate. In some examples, one or more of such components also (e.g., the flexible antennas and the flexible interconnect circuits) may be printed on the flexible battery substrate.

In some examples, the flexible circuit 116 is formed on a flexible substrate by printing, etching, or laminating circuit patterns on the flexible substrate. In some examples, the flexible circuit 116 is implemented by one or more of a single-sided flex circuit, a double access or back bared flex circuit, a sculpted flex circuit, a double-sided flex circuit, a multi-layer flex circuit, a rigid flex circuit, and a polymer thick film flex circuit. A single-sided flexible circuit has a single conductor layer made of, for example, a metal or conductive (e.g., metal filled) polymer on a flexible dielectric film. A double access or back bared flexible circuit has a single conductor layer but is processed so as to allow access to selected features of the conductor pattern from both sides. A sculpted flex circuit is formed using a multi-step etching process that produces a flex circuit that has finished copper conductors that vary in thickness along their respective lengths. A multilayer flex circuit has three of more layers of conductors, where the layers typically are interconnected using plated through holes. Rigid flex circuits are a hybrid construction of flex circuit consisting of rigid and flexible substrates that are laminated together into a single structure, where the layers typically are electrically interconnected via plated through holes. In polymer thick film (PTF) flex circuits, the circuit conductors are printed onto a polymer base film, where there may be a single conductor layer or multiple conductor layers that are insulated from one another by respective printed insulating layers.

In the example flexible adhesive tape platform segments 102 shown in FIGS. 5A-5C, the flexible circuit 116 is a single access flex circuit that interconnects the components of the adhesive tape platform on a single side of the flexible circuit 116. In other examples, the flexible circuit 116 is a double access flex circuit that includes a front-side conductive pattern that interconnects the low power communications interface 81, the timer circuit 83, the processor 90, the one or more transducers 94 (if present), and the memory 96, and allows through-hole access (not shown) to a back-side conductive pattern that is connected to the flexible battery (not shown). In these examples, the front-side conductive pattern of the flexible circuit 116 connects the communications circuits 82, 86 (e.g., receivers, transmitters, and transceivers) to their respective antennas 84, 88 and to the processor 90, and also connects the processor 90 to the one or more sensors 94 and the memory 96. The backside conductive pattern connects the active electronics (e.g., the processor 90, the communications circuits 82, 86, and the transducers) on the front-side of the flexible circuit 116 to the electrodes of the flexible battery 116 via one or more through holes in the substrate of the flexible circuit 116.

Depending on the target application, the wireless transducing circuits 70 are distributed across the flexible adhesive tape platform 100 according to a specified sampling density, which is the number of wireless transducing circuits 70 for a given unit size (e.g., length or area) of the flexible adhesive tape platform 100. In some examples, a set of multiple flexible adhesive tape platforms 100 are provided that include different respective sampling densities in order to seal different asset sizes with a desired number of wireless transducing circuits 70. In particular, the number of wireless transducing circuits per asset size is given by the product of the sampling density specified for the adhesive tape platform and the respective size of the adhesive tape platform 100 needed to seal the asset. This allows an automated packaging system to select the appropriate type of flexible adhesive tape platform 100 to use for sealing a given asset with the desired redundancy (if any) in the number of wireless transducer circuits 70. In some example applications (e.g., shipping low value goods), only one wireless transducing circuit 70 is used per asset, whereas in other applications (e.g., shipping high value goods) multiple wireless transducing circuits 70 are used per asset. Thus, a flexible adhesive tape platform 100 with a lower sampling density of wireless transducing circuits 70 can be used for the former application, and a flexible adhesive tape platform 100 with a higher sampling density of wireless transducing circuits 70 can be used for the latter application. In some examples, the flexible adhesive tape platforms 100 are color-coded or otherwise marked to indicate the respective sampling densities with which the wireless transducing circuits 70 are distributed across the different types of adhesive tape platforms 100.

Figure 6A:
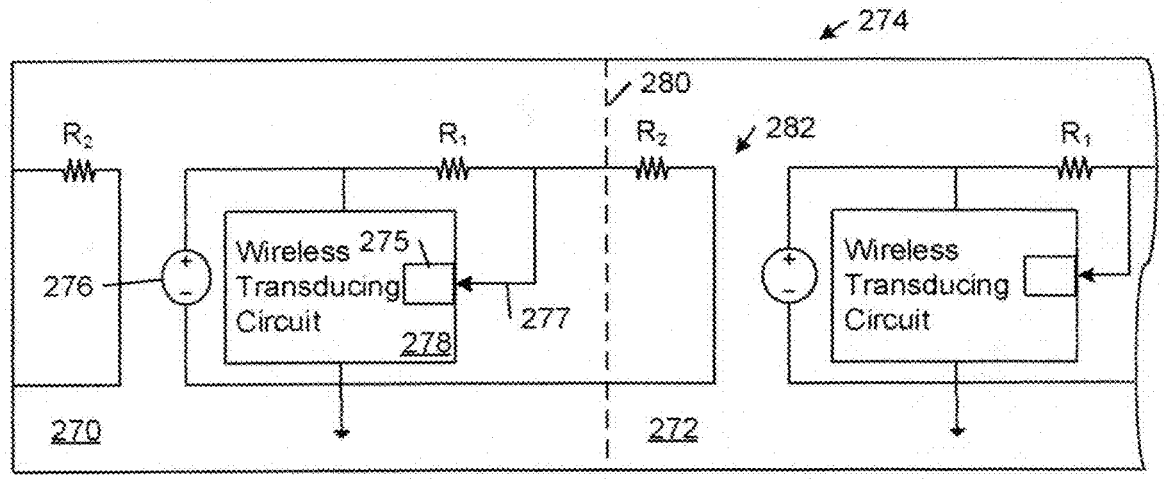
FIGS. 6A-6B are diagrammatic top views of a length of an example adhesive tape platform, according to some embodiments.

Referring to FIG. 6A, in some examples, each of one or more of the segments 270, 272 of a flexible adhesive tape platform 274 includes a respective one-time wake circuit 275 that delivers power from the respective energy source 276 to the respective wireless circuit 278 (e.g., a processor, one or more transducers, and one or more wireless communications circuits) in response to an event. In some of these examples, the wake circuit 275 is configured to transition from an off state to an on state when the voltage on the wake node 277 exceeds a threshold level, at which point the wake circuit transitions to an on state to power-on the segment 270. In the illustrated example, this occurs when the user separates the segment from the adhesive tape platform 274, for example, by cutting across the adhesive tape platform 274 at a designated location (e.g., along a designated cut-line 280). In particular, in its initial, un-cut state, a minimal amount of current flows through the resistors R1 and R2. As a result, the voltage on the wake node 277 remains below the threshold turn-on level. After the user cuts across the adhesive tape platform 274 along the designated cut-line 280, the user creates an open circuit in the loop 282, which pulls the voltage of the wake node above the threshold level and turns on the wake circuit 275. As a result, the voltage across the energy source 276 will appear across the wireless circuit 278 and, thereby, turn on the segment 270. In particular embodiments, the resistance value of resistor R1 is greater than the resistance value of R2. In some examples, the resistance values of resistors R1 and R2 are selected based on the overall design of the adhesive product system (e.g., the target wake voltage level and a target leakage current).

In some examples, each of one or more of the segments of an adhesive tape platform includes a respective sensor and a respective wake circuit that delivers power from the respective energy source to the respective one or more of the respective wireless circuit components 278 in response to an output of the sensor. In some examples, the respective sensor is a strain sensor that produces a wake signal based on a change in strain in the respective segment. In some of these examples, the strain sensor is affixed to a adhesive tape platform and configured to detect the stretching of the tracking adhesive tape platform segment as the segment is being peeled off a roll or a sheet of the adhesive tape platform. In some examples, the respective sensor is a capacitive sensor that produces a wake signal based on a change in capacitance in the respective segment. In some of these examples, the capacitive sensor is affixed to an adhesive tape platform and configured to detect the separation of the tracking adhesive tape platform segment from a roll or a sheet of the adhesive tape platform. In some examples, the respective sensor is a flex sensor that produces a wake signal based on a change in curvature in the respective segment. In some of these examples, the flex sensor is affixed to a adhesive tape platform and configured to detect bending of the tracking adhesive tape platform segment as the segment is being peeled off a roll or a sheet of the adhesive tape platform. In some examples, the respective sensor is a near field communications sensor that produces a wake signal based on a change in inductance in the respective segment.

Figure 6B:
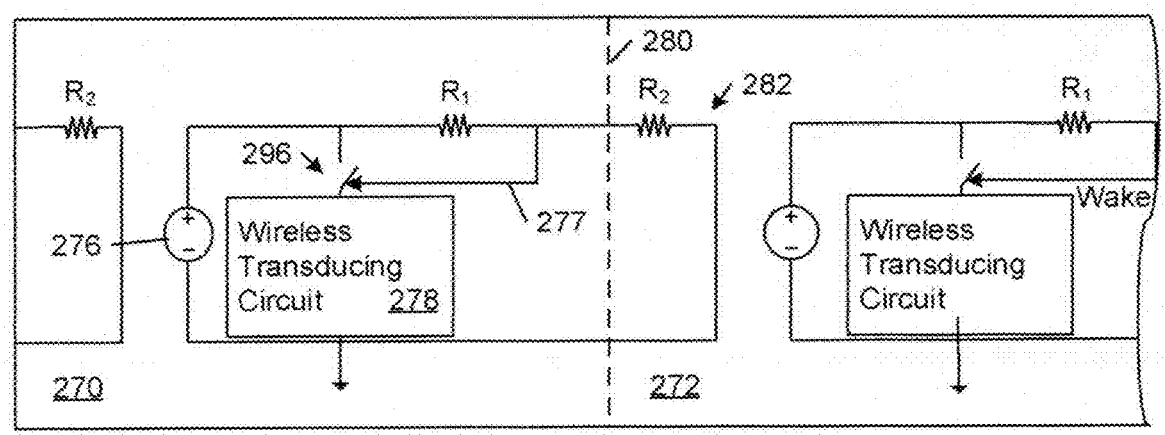

FIG. 6B shows another example of an adhesive tape platform 294 that delivers power from the respective energy source 276 to the respective tracking circuit 278 (e.g., a processor, one or more transducers, and one or more wireless communications circuits) in response to an event. This example is similar in structure and operation as the adhesive tape platform 294 shown in FIG. 6A, except that the wake circuit 275 is implemented by a switch 296 that is configured to transition from an open state to a closed state when the voltage on the switch node 277 exceeds a threshold level. In the initial state of the adhesive tape platform 294, the voltage on the switch node is below the threshold level as a result of the low current level flowing through the resistors R1 and R2. After the user cuts across the adhesive tape platform 294 along the designated cut-line 280, the user creates an open circuit in the loop 282, which pulls up the voltage on the switch node above the threshold level to close the switch 296 and turn on the wireless circuit 278.

Figure 6C:
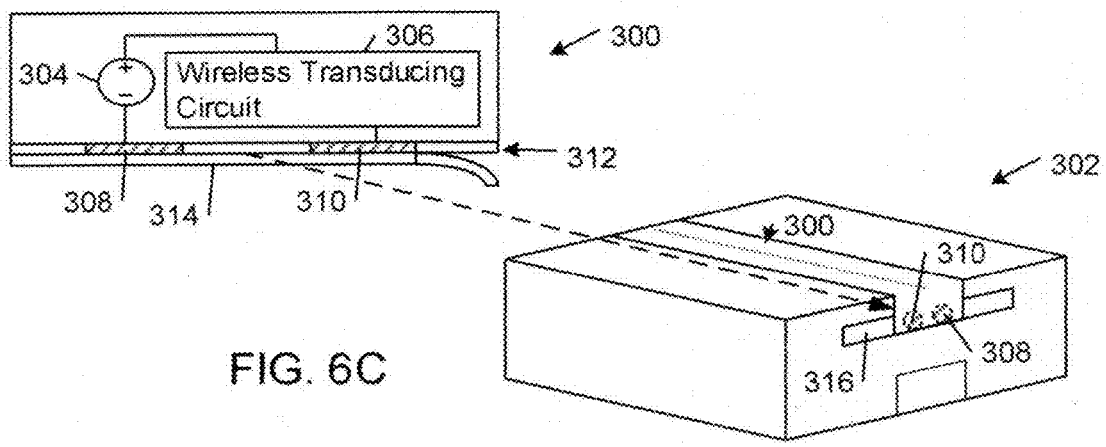
FIG. 6C is a diagrammatic view of a length of an example adhesive tape platform adhered to an asset, according to some embodiments.

FIG. 6C shows a diagrammatic cross-sectional front view of an example adhesive tape platform 300 and a perspective view of an example asset 302. Instead of activating the adhesive tape platform in response to separating a segment of the adhesive tape platform from a roll or a sheet of the adhesive tape platform, this example is configured to supply power from the energy source 302 to turn on the wireless transducing circuit 306 in response to establishing an electrical connection between two power terminals 308, 310 that are integrated into the adhesive tape platform. In particular, each segment of the adhesive tape platform 300 includes a respective set of embedded tracking components, an adhesive layer 312, and an optional backing sheet 314 with a release coating that prevents the segments from adhering strongly to the backing sheet 314. In some examples, the power terminals 308, 310 are composed of an electrically conductive material (e.g., a metal, such as copper) that may be printed or otherwise patterned and/or deposited on the backside of the adhesive tape platform 300. In operation, the adhesive tape platform can be activated by removing the backing sheet 314 and applying the exposed adhesive layer 312 to a surface that includes an electrically conductive region 316. In the illustrated embodiment, the electrically conductive region 316 is disposed on a portion of the asset 302. When the adhesive backside of the adhesive tape platform 300 is adhered to the asset with the exposed terminals 308, 310 aligned and in contact with the electrically conductive region 316 on the asset 302, an electrical connection is created through the electrically conductive region 316 between the exposed terminals 308, 310 that completes the circuit and turns on the wireless transducing circuit 306. In particular embodiments, the power terminals 308, 310 are electrically connected to any respective nodes of the wireless transducing circuit 306 that would result in the activation of the tracking circuit 306 in response to the creation of an electrical connection between the power terminals 308, 310.

In some examples, after a tape node is turned on, it will communicate with the network service to confirm that the user/operator who is associated with the tape node is an authorized user who has authenticated himself or herself to the network service 54. In these examples, if the tape node cannot confirm that the user/operator is an authorized user, the tape node will turn itself off.

Deployment of Tape Nodes

Figure 7:
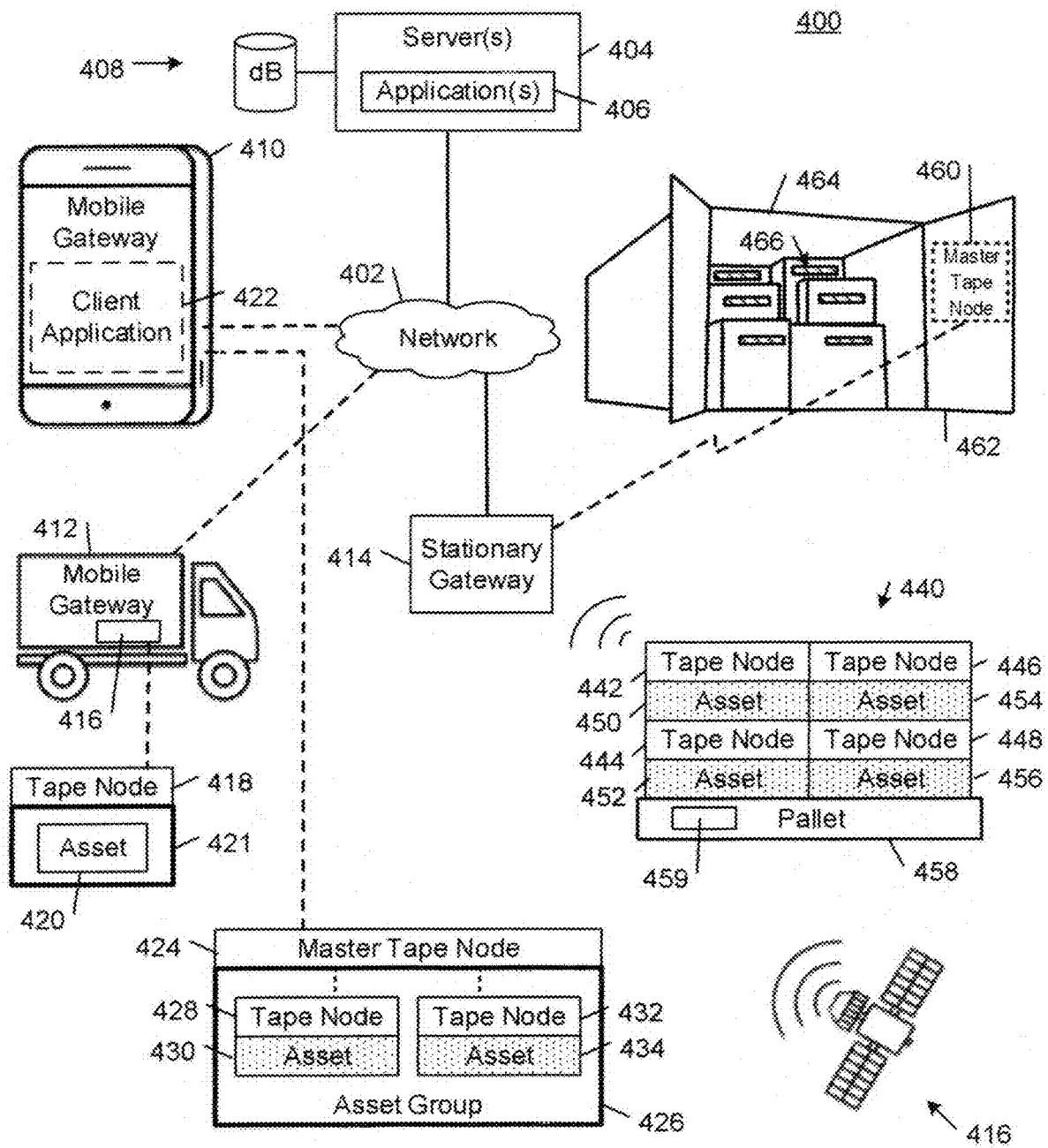
FIG. 7 is a diagrammatic view of an example of a network environment supporting communications with segments of an adhesive tape platform, according to some embodiments.

FIG. 7 shows an example network communications environment 400 (also referred to herein as an "IOT system" 400) that includes a network 402 that supports communications between one or more servers 404 executing one or more applications of a network service 408, mobile gateways 410, 412, a stationary gateway 414, and various types of tape nodes that are associated with various assets (e.g., parcels, equipment, tools, persons, and other things). Each member of the IOT system 400 may be referred to as a node of the IOT system 400, including the tape nodes, other wireless IOT devices, gateways (stationary and mobile), client devices, and servers. In some examples, the network 402 includes one or more network communication systems and technologies, including any one or more of wide area networks, local area networks, public networks (e.g., the internet), private networks (e.g., intranets and extranets), wired networks, and wireless networks. For example, the network 402 includes communications infrastructure equipment, such as a geolocation satellite system 416 (e.g., GPS, GLONASS, and NAVSTAR), cellular communication systems (e.g., GSM/GPRS), Wi-Fi communication systems, RF communication systems (e.g., LoRa), Bluetooth communication systems (e.g., a Bluetooth Low Energy system), Z-wave communication systems, and ZigBee communication systems.

In some examples, the one or more network service applications 406 leverage the above-mentioned communications technologies to create a hierarchical wireless network of tape nodes that improves asset management operations by reducing costs and improving efficiency in a wide range of processes, from asset packaging, asset transporting, asset tracking, asset condition monitoring, asset inventorying, and asset security verification. Communication across the network is secured by a variety of different security mechanisms. In the case of existing infrastructure, a communication link the communication uses the infrastructure security mechanisms. In case of communications among tapes nodes, the communication is secured through a custom security mechanism. In certain cases, tape nodes can also be configured to support block chain to protect the transmitted and stored data.

A set of tape nodes can be configured by the network service 408 to create hierarchical communications network. The hierarchy can be defined in terms of one or more factors, including functionality (e.g., wireless transmission range or power), role (e.g., master tape node vs. peripheral tape node), or cost (e.g., a tape node equipped with a cellular transceiver vs. a peripheral tape node equipped with a Bluetooth LE transceiver). Tape nodes can be assigned to different levels of a hierarchical network according to one or more of the above-mentioned factors. For example, the hierarchy can be defined in terms of communication range or power, where tape nodes with higher power or longer communication range transceivers are arranged at a higher level of the hierarchy than tape nodes with lower power or lower range transceivers. In another example, the hierarchy is defined in terms of role, where, e.g., a master tape node is programmed to bridge communications between a designated group of peripheral tape nodes and a gateway node or server node. The problem of finding an optimal hierarchical structure can be formulated as an optimization problem with battery capacity of nodes, power consumption in various modes of operation, desired latency, external environment, etc. and can be solved using modern optimization methods e.g. neural networks, artificial intelligence, and other machine learning computing systems that take expected and historical data to create an optimal solution and can create algorithms for modifying the system's behavior adaptively in the field.

The tape nodes may be deployed by automated equipment or manually. In this process, a tape node typically is separated from a roll or sheet and adhered to a asset, or other stationary or mobile object (e.g., a structural element of a warehouse, or a vehicle, such as a delivery truck) or stationary object (e.g., a structural element of a building). This process activates the tape node and causes the tape node to communicate with a server 404 of the network service 408. In this process, the tape node may communicate through one or more other tape nodes in the communication hierarchy. In this process, the network server 404 executes the network service application 406 to programmatically configure tape nodes that are deployed in the environment 400. In some examples, there are multiple classes or types of tape nodes, where each tape node class has a different respective set of functionalities and/or capacities.

In some examples, the one or more network service servers 404 communicate over the network 402 with one or more gateways that are configured to send, transmit, forward, or relay messages to the network 402 and activated tape nodes that are associated with respective assets and within communication range. Example gateways include mobile gateways 410, 412 and a stationary gateway 414. In some examples, the mobile gateways 410, 412, and the stationary gateway 414 are able to communicate with the network 402 and with designated sets or groups of tape nodes.

In some examples, the mobile gateway 412 is a vehicle (e.g., a delivery truck or other mobile hub) that includes a wireless communications unit 416 that is configured by the network service 408 to communicate with a designated set of tape nodes, including a peripheral tape node 418 in the form of a label that is adhered to an asset 420 contained within a parcel 421 (e.g., an envelope), and is further configured to communicate with the network service 408 over the network 402. In some examples, the peripheral tape node 418 includes a lower power wireless communications interface of the type used in, e.g., tape node 102 (shown in FIG. 5A), and the wireless communications unit 416 is implemented by a tape node (e.g., one of tape node 103 or tape node 105, respectively shown in FIGS. 5B and 5C) that includes a lower power communications interface for communicating with tape nodes within range of the mobile gateway 412 and a higher power communications interface for communicating with the network 402. In this way, the tape nodes 418 and 416 create a hierarchical wireless network of nodes for transmitting, forwarding, bridging, relaying, or otherwise communicating wireless messages to, between, or on behalf of the peripheral tape node 418 and the network service 408 in a power-efficient and cost-effective way.

In some examples, the mobile gateway 410 is a mobile phone that is operated by a human operator and executes a client application 422 that is configured by the network service 408 to communicate with a designated set of tape nodes, including a master tape node 424 that is adhered to a parcel 426 (e.g., a box), and is further configured to communicate with the network service 408 over the network 402. In the illustrated example, the parcel 426 contains a first parcel labeled or sealed by a tape node 428 and containing a first asset 430, and a second parcel labeled or sealed by a tape node 432 and containing a second asset 434. As explained in detail below, the master tape node 424 communicates with each of the peripheral tape nodes 428, 432 and communicates with the mobile gateway 408 in accordance with a hierarchical wireless network of tape nodes. In some examples, each of the peripheral tape nodes 428, 432 includes a lower power wireless communications interface of the type used in, e.g., tape node 102 (shown in FIG. 5A), and the master tape node 424 is implemented by a tape node (e.g., tape node 103, shown in FIG. 5B) that includes a lower power communications interface for communicating with the peripheral tape nodes 428, 432 contained within the parcel 426, and a higher power communications interface for communicating with the mobile gateway 410. The master tape node 424 is operable to relay wireless communications between the tape nodes 428, 432 contained within the parcel 426 and the mobile gateway 410, and the mobile gateway 410 is operable to relay wireless communications between the master tape node 424 and the network service 408 over the wireless network 402. In this way, the master tape node 424 and the peripheral tape nodes 428 and 432 create a hierarchical wireless network of nodes for transmitting, forwarding, relaying, or otherwise communicating wireless messages to, between, or on behalf of the peripheral tape nodes 428, 432 and the network service 408 in a power-efficient and cost-effective way.

In some examples, the stationary gateway 414 is implemented by a server executing a server application that is configured by the network service 408 to communicate with a designated set 440 of tape nodes 442, 444, 446, 448 that are adhered to respective parcels containing respective assets 450, 452, 454, 456 on a pallet 458. In other examples, the stationary gateway 414 is implemented by a tape node (e.g., one of tape node 103 or tape node 105, respectively shown in FIGS. 5B and 5C) that is adhered to, for example, a wall, column or other infrastructure component of the environment 400, and includes a lower power communications interface for communicating with tape nodes within range of the stationary gateway 414 and a higher power communications interface for communicating with the network 402. In one embodiment, each of the tape nodes 442-448 is a peripheral tape node and is configured by the network service 408 to communicate individually with the stationary gateway 414, which relays communications from the tape nodes 442-448 to the network service 408 through the stationary gateway 414 and over the communications network 402. In another embodiment, one of the tape nodes 442-448 at a time is configured as a master tape node that transmits, forwards, relays, or otherwise communicate wireless messages to, between, or on behalf of the other tape nodes on the pallet 458. In this embodiment, the master tape node may be determined by the tape nodes 442-448 or designated by the network service 408. In some examples, the tape node with the longest range or highest remaining power level is determined to be the master tape node. In some examples, when the power level of the current master tape node drops below a certain level (e.g., a fixed power threshold level or a threshold level relative to the power levels of one or more of the other tape nodes), another one of the tape nodes assumes the role of the master tape node. In some examples, a master tape node 459 is adhered to the pallet 458 and is configured to perform the role of a master node for the tape nodes 442-448. In these ways, the tape nodes 442-448, 458 are configurable to create different hierarchical wireless networks of nodes for transmitting, forwarding, relaying, bridging, or otherwise communicating wireless messages with the network service 408 through the stationary gateway 414 and over the network 402 in a power-efficient and cost-effective way.

In the illustrated example, the stationary gateway 414 also is configured by the network service 408 to communicate with a designated set of tape nodes, including a master tape node 460 that is adhered to the inside of a door 462 of a shipping container 464, and is further configured to communicate with the network service 408 over the network 402. In the illustrated example, the shipping container 464 contains a number of parcels labeled or sealed by respective peripheral tape nodes 466 and containing respective assets. The master tape node 416 communicates with each of the peripheral tape nodes 466 and communicates with the stationary gateway 415 in accordance with a hierarchical wireless network of tape nodes. In some examples, each of the peripheral tape nodes 466 includes a lower power wireless communications interface of the type used in, e.g., tape node 102 (shown in FIG. 5A), and the master tape node 460 is implemented by a tape node (e.g., tape node 103, shown in FIG. 5B) that includes a lower power communications interface for communicating with the peripheral tape nodes 466 contained within the shipping container 464, and a higher power communications interface for communicating with the stationary gateway 414.

In some examples, when the doors of the shipping container 464 are closed, the master tape node 460 is operable to communicate wirelessly with the peripheral tape nodes 466 contained within the shipping container 464. In an example, the master tape node 460 is configured to collect sensor data from the peripheral tape nodes and, in some embodiments, process the collected data to generate, for example, one or more histograms from the collected data. When the doors of the shipping container 464 are open, the master tape node 460 is programmed to detect the door opening (e.g., with an accelerometer component of the master tape node 460) and, in addition to reporting the door opening event to the network service 408, the master tape node 460 is further programmed to transmit the collected data and/or the processed data in one or more wireless messages to the stationary gateway 414. The stationary gateway 414, in turn, is operable to transmit the wireless messages received from the master tape node 460 to the network service 408 over the wireless network 402. Alternatively, in some examples, the stationary gateway 414 also is operable to perform operations on the data received from the master tape node 460 with the same type of data produced by the master node 459 based on sensor data collected from the tape nodes 442-448. In this way, the master tape node 460 and the peripheral tape nodes 466 create a hierarchical wireless network of nodes for transmitting, forwarding, relaying, or otherwise communicating wireless messages to, between, or on behalf of the peripheral tape nodes 466 and the network service 408 in a power-efficient and cost-effective way.

In an example of the embodiment shown in FIG. 7, there are three classes of tape nodes: a short range tape node, a medium range tape node, and a long range tape node, as respectively shown in FIGS. 5A-5C. The short range tape nodes typically are adhered directly to parcels containing assets. In the illustrated example, the tape nodes 418, 428, 432, 442-448, 466 are short range tape nodes. The short range tape nodes typically communicate with a low power wireless communication protocol (e.g., Bluetooth LE, Zigbee, or Z-wave). The medium range tape nodes typically are adhered to objects (e.g., a box 426 and a shipping container 460) that are associated with multiple parcels that are separated from the medium range tape nodes by a barrier or a large distance. In the illustrated example, the tape nodes 424 and 460 are medium range tape nodes. The medium range tape nodes typically communicate with a medium power wireless communication protocol (e.g., LoRa or Wi-Fi). The long-range tape nodes typically are adhered to mobile or stationary infrastructure of the wireless communication environment 400. In the illustrated example, the mobile gateway tape node 412 and the stationary gateway tape node 414 are long range tape nodes. The long range tape nodes typically communicate with other nodes using a high power wireless communication protocol (e.g., a cellular data communication protocol). In some examples, the mobile gateway tape node 436 is adhered to a mobile vehicle (e.g., a truck). In these examples, the mobile gateway 412 may be moved to different locations in the environment 400 to assist in connecting other tape nodes to the server 404. In some examples, the stationary gateway tape node 414 may be attached to a stationary structure (e.g., a wall) in the environment 400 with a known geographic location. In these examples, other tape nodes in the environment can determine their geographic location by querying the gateway tape node 414.

Wireless Communications Network

Figure 8:
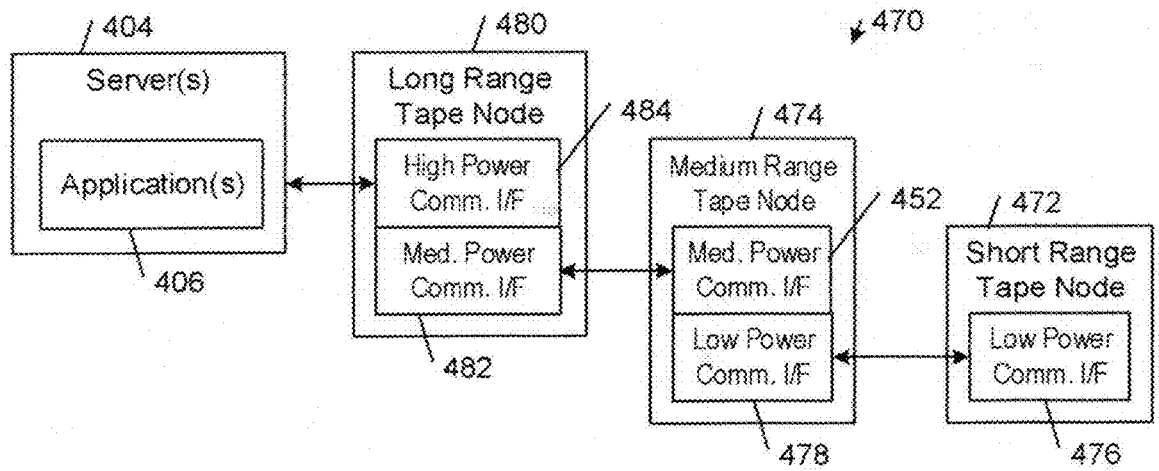
FIG. 8 is a diagrammatic view of a hierarchical communications network, according to some embodiments.

FIG. 8 shows an example hierarchical wireless communications network of tape nodes 470. In this example, the short range tape node 472 and the medium range tape node 474 communicate with one another over their respective low power wireless communication interfaces 476, 478. The medium range tape node 474 and the long range tape node 480 communicate with one another over their respective medium power wireless communication interfaces 478, 482. The long range tape node 480 and the network server 404 communicate with one another over the high power wireless communication interface 484. In some examples, the low power communication interfaces 476, 478 establish wireless communications with one another in accordance with the Bluetooth LE protocol, the medium power communication interfaces 452, 482 establish wireless communications with one another in accordance with the LoRa communications protocol, and the high power communication interface 484 establishes wireless communications with the server 404 in accordance with a cellular communications protocol.

In some examples, the different types of tape nodes are deployed at different levels in the communications hierarchy according to their respective communications ranges, with the long range tape nodes generally at the top of the hierarchy, the medium range tape nodes generally in the middle of the hierarchy, and the short range tape nodes generally at the bottom of the hierarchy. In some examples, the different types of tape nodes are implemented with different feature sets that are associated with component costs and operational costs that vary according to their respective levels in the hierarchy. This allows system administrators flexibility to optimize the deployment of the tape nodes to achieve various objectives, including cost minimization, asset tracking, asset localization, and power conservation.

In some examples, a server 404 of the network service 408 designates a tape node at a higher level in a hierarchical communications network as a master node of a designated set of tape nodes at a lower level in the hierarchical communications network. For example, the designated master tape node may be adhered to a parcel (e.g., a box, pallet, or shipping container) that contains one or more tape nodes that are adhered to one or more assets containing respective assets. In order to conserve power, the tape nodes typically communicate according to a schedule promulgated by the server 404 of the network service 408. The schedule usually dictates all aspects of the communication, including the times when particular tape nodes should communicate, the mode of communication, and the contents of the communication. In one example, the server 404 transmits programmatic Global Scheduling Description Language (GSDL) code to the master tape node and each of the lower-level tape nodes in the designated set. In this example, execution of the GSDL code causes each of the tape nodes in the designated set to connect to the master tape node at a different respective time that is specified in the GSDL code, and to communicate a respective set of one or more data packets of one or more specified types of information over the respective connection. In some examples, the master tape node simply forwards the data packets to the server network node 404, either directly or indirectly through a gateway tape node (e.g., the long range tape node 416 adhered to the mobile vehicle 412 or the long range tape node 414 adhered to an infrastructure component of the environment 400). In other examples, the master tape node processes the information contained in the received data packets and transmits the processed information to the server network node 404.

Figure 9:
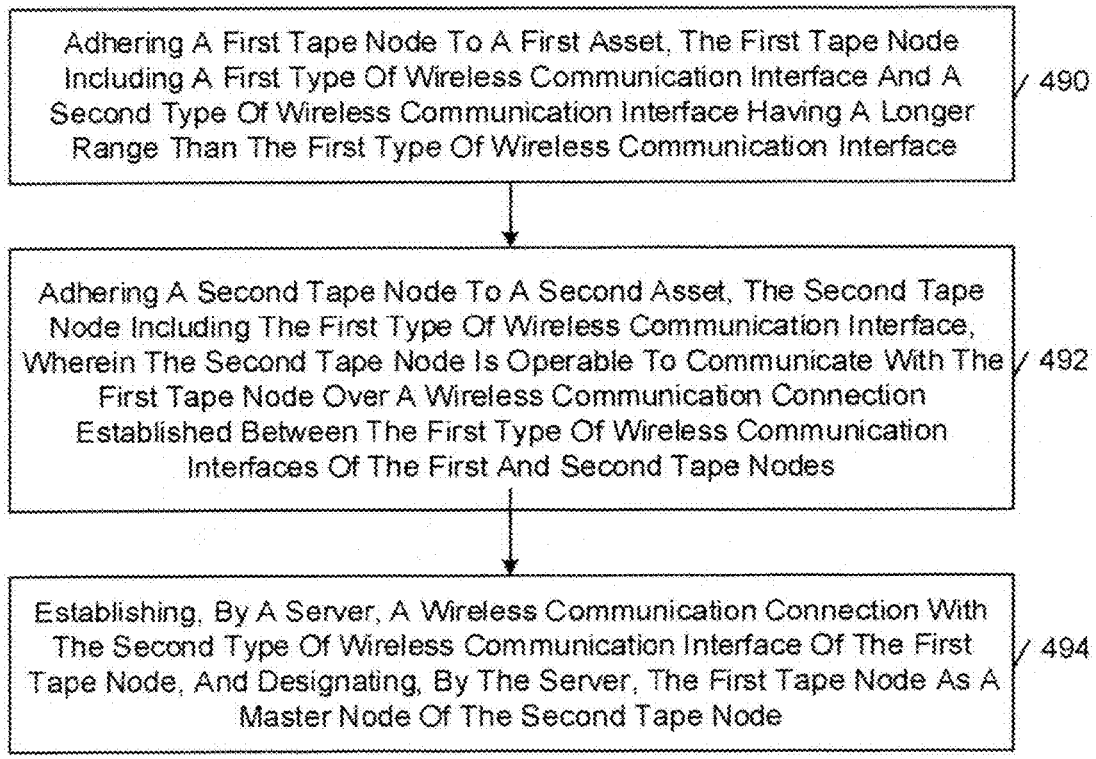
FIG. 9 is a flow diagram of a method of creating a hierarchical communications network, according to some embodiments.

FIG. 9 shows an example method of creating a hierarchical communications network. In accordance with this method, a first tape node is adhered to a first asset in a set of associated assets, the first tape node including a first type of wireless communication interface and a second type of wireless communication interface having a longer range than the first type of wireless communication interface (FIG. 9, block 490). A second tape node is adhered to a second asset in the set, the second tape node including the first type of wireless communication interface, wherein the second tape node is operable to communicate with the first tape node over a wireless communication connection established between the first type of wireless communication interfaces of the first and second tape nodes (FIG. 9, block 492). An application executing on a computer system (e.g., a server 404 of a network service 408) establishes a wireless communication connection with the second type of wireless communication interface of the first tape node, and the application transmits programmatic code executable by the first tape node to function as a master tape node with respect to the second tape node (FIG. 9, block 494).

In other embodiments, the second tape node is assigned the role of the master node of the first tape node.

Distributed Agent Operating System

As used herein, the term "node" refers to both a tape node and a non-tape node (i.e., a node or wireless device that is not an adhesive tape platform) unless the node is explicitly designated as a "tape node" or a "non-tape node." In some embodiments, a non-tape node may have the same or similar communication, sensing, processing and other functionalities and capabilities as the tape nodes described herein, except without being integrated into a tape platform. In some embodiments, non-tape nodes can interact seamlessly with tape nodes. Each node may be assigned a respective unique identifier, according to some embodiments.

The following disclosure describes a distributed software operating system that is implemented by distributed hardware nodes executing intelligent agent software to perform various tasks or algorithms. In some embodiments, the operating system distributes functionalities (e.g., performing analytics on data or statistics collected or generated by nodes) geographically across multiple intelligent agents that are bound to items (e.g., parcels, containers, packages, boxes, pallets, a loading dock, a door, a light switch, a vehicle such as a delivery truck, a shipping facility, a port, a hub, etc.). In addition, the operating system dynamically allocates the hierarchical roles (e.g., master and slave roles)

that nodes perform over time in order to improve system performance, such as optimizing battery life across nodes, improving responsiveness, and achieving overall objectives. In some embodiments, optimization is achieved using a simulation environment for optimizing key performance indicators (PKIs).

In some embodiments, the nodes are programmed to operate individually or collectively as autonomous intelligent agents. In some embodiments, nodes are configured to communicate and coordinate actions and respond to events. In some embodiments, a node is characterized by its identity, its mission, and the services that it can provide to other nodes. A node's identity is defined by its capabilities (e.g., battery life, sensing capabilities, and communications interfaces). A node's mission (or objective) is defined by the respective program code, instructions, or directives it receives from another node (e.g., a server or a master node) and the actions or tasks that it performs in accordance with that program code, instructions, or directives (e.g., sense temperature every hour and send temperature data to a master node to upload to a server). A node's services define the functions or tasks that it is permitted to perform for other nodes (e.g., retrieve temperature data from a peripheral node and send the received temperature data to the server). At least for certain tasks, once programmed and configured with their identities, missions, and services, nodes can communicate with one another and request services from and provide services to one another independently of the server.

Thus, in accordance with the runtime operating system every agent knows its objectives (programmed). Every agent knows which capabilities/resources it needs to fulfill objective. Every agent communicates with every other node in proximity to see if it can offer the capability. Examples include communicate data to the server, authorize going to lower power level, temperature reading, send an alert to local hub, send location data, triangulate location, any boxes in same group that already completed group objectives.

Nodes can be associated with items. Examples of an item includes, but are not limited to for example, a package, a box, pallet, a container, a truck or other conveyance, infrastructure such as a door, a conveyor belt, a light switch, a road, or any other thing that can be tracked, monitored, sensed, etc. or that can transmit data concerning its state or environment. In some examples, a server or a master node may associate the unique node identifiers with the items.

Communication paths between tape and/or non-tape nodes may be represented by a graph of edges between the corresponding assets (e.g., a storage unit, truck, or hub). In some embodiments, each node in the graph has a unique identifier. A set of connected edges between nodes is represented by a sequence of the node identifiers that defines a communication path between a set of nodes.

Figure 10A:
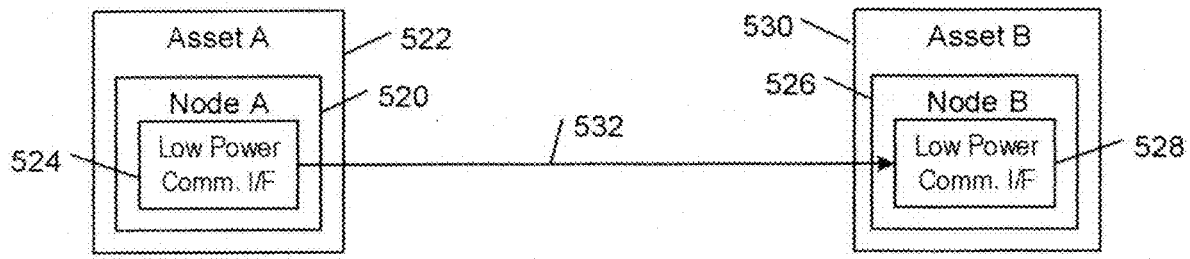
FIGS. 10A-10E are diagrammatic views of exemplary use cases for a distributed agent operating system, according to some embodiments. \

Referring to FIG. 10A, a node 520 (Node A) is associated with an asset 522 (Asset A). In some embodiments, the node 520 may be implemented as a tape node that is used to seal the asset 522 or it may be implemented as a label node that is used to label the asset 522; alternatively, the node 520 may be implemented as a non-tape node that is inserted within the asset 522 or embedded in or otherwise attached to the interior or exterior of the asset 522. In the illustrated embodiment, the node 520 includes a low power communications interface 524 (e.g., a Bluetooth Low Energy communications interface). Another node 526 (Node B), which is associated with another asset 530 (Asset B), is similarly equipped with a compatible low power communications interface 528 (e.g., a Bluetooth Low Energy communications interface).

In an example scenario, in accordance with the programmatic code stored in its memory, node 526 (Node B) requires a connection to node 520 (Node A) to perform a task that involves checking the battery life of Node A. Initially, Node B is unconnected to any other nodes. In accordance with the programmatic code stored in its memory, Node B periodically broadcasts advertising packets into the surrounding area. When the other node 520 (Node A) is within range of Node B and is operating in a listening mode, Node A will extract the address of Node B and potentially other information (e.g., security information) from an advertising packet. If, according to its programmatic code, Node A determines that it is authorized to connect to Node B, Node A will attempt to pair with Node B. In this process, Node A and Node B determine each other's identities, capabilities, and services. For example, after successfully establishing a communication path 532 with Node A (e.g., a Bluetooth Low Energy formatted communication path), Node B determines Node A's identity information (e.g., master node), Node A's capabilities include reporting its current battery life, and Node A's services include transmitting its current battery life to other nodes. In response to a request from Node B, Node A transmits an indication of its current battery life to Node B.

Figure 10B:
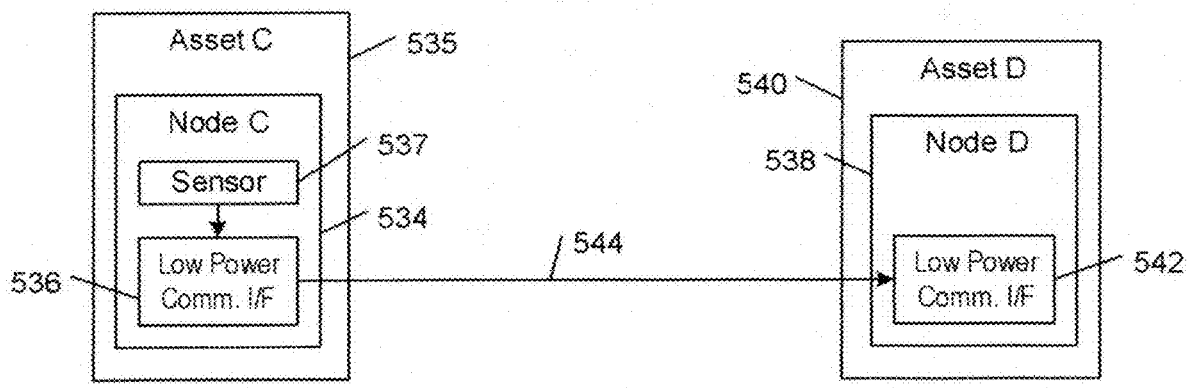

Referring to FIG. 10B, a node 534 (Node C) is associated with an asset 535 (Asset C). In the illustrated embodiment, the Node C includes a low power communications interface 536 (e.g., a Bluetooth Low Energy communications interface), and a sensor 537 (e.g., a temperature sensor). Another node 538 (Node D), which is associated with another asset 540 (Asset D), is similarly equipped with a compatible low power communications interface 542 (e.g., a Bluetooth Low Energy communications interface).

In an example scenario, in accordance with the programmatic code stored in its memory, Node D requires a connection to Node C to perform a task that involves checking the temperature in the vicinity of Node C. Initially, Node D is unconnected to any other nodes. In accordance with the programmatic code stored in its memory, Node D periodically broadcasts advertising packets in the surrounding area. When Node C is within range of Node D and is operating in a listening mode, Node C will extract the address of Node D and potentially other information (e.g., security information) from the advertising packet. If, according to its programmatic code, Node C determines that it is authorized to connect to Node D, Node C will attempt to pair with Node D. In this process, Node C and Node D determine each other's identities, capabilities, and services. For example, after successfully establishing a communication path 544 with Node C (e.g., a Bluetooth Low Energy formatted communication path), Node D determines Node C's identity information (e.g., a peripheral node), Node C's capabilities include retrieving temperature data, and Node C's services include transmitting temperature data to other nodes. In response to a request from Node D, Node C transmits its measured and/or locally processed temperature data to Node D.

Figure 10C:
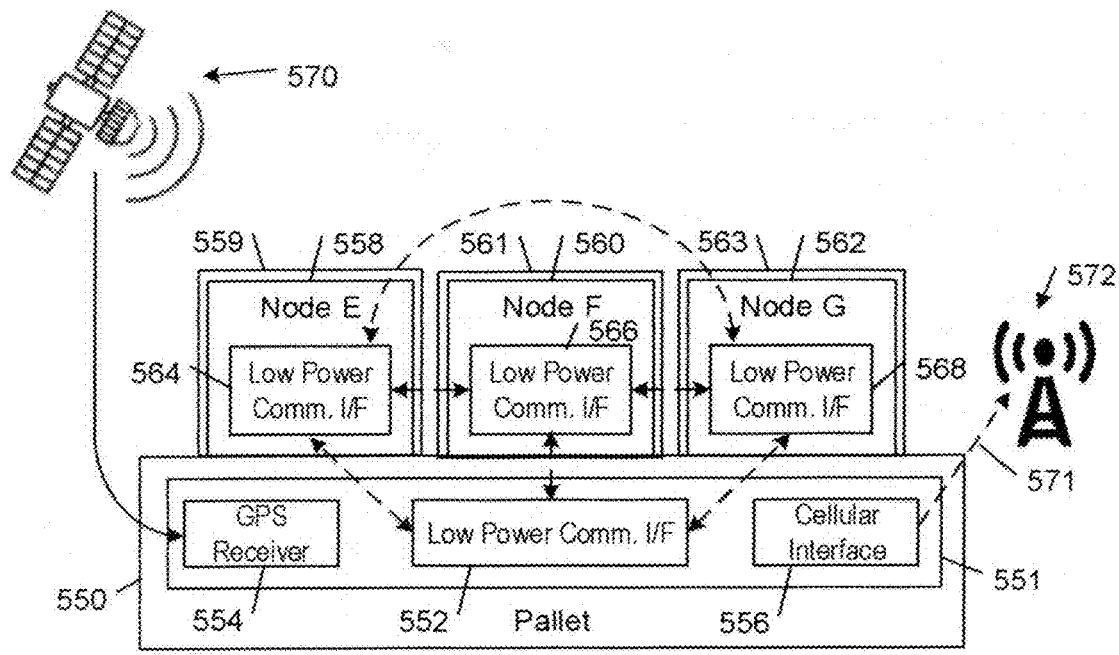

Referring to FIG. 10C, a pallet 550 is associated with a master node 551 that includes a low power communications interface 552, a GPS receiver 554, and a cellular communications interface 556. In some embodiments, the master node 551 may be implemented as a tape node or a label node that is adhered to the pallet 550. In other embodiments, the master node 551 may be implemented as a non-tape node that is inserted within the body of the pallet 550 or embedded in or otherwise attached to the interior or exterior of the pallet 550.

The pallet 550 provides a structure for grouping and containing assets 559, 561, 563 each of which is associated with a respective peripheral node 558, 560, 562 (Node E, Node F, and Node G). Each of the peripheral nodes 558, 560, 562 includes a respective low power communications interface 564, 566, 568 (e.g., Bluetooth. Low Energy communications interface). In the illustrated embodiment, each of the nodes E, F, G and the master node 551 are connected to each of the other nodes over a respective low power communications path (shown by dashed lines).

In some embodiments, the assets 559, 561, 563 are grouped together because they are related. For example, the assets 559, 561, 563 may share the same shipping itinerary or a portion thereof. In an example scenario, the master pallet node 550 scans for advertising packets that are broadcasted from the peripheral nodes 558, 560, 562. In some examples, the peripheral nodes broadcast advertising packets during respective scheduled broadcast intervals. The master node 551 can determine the presence of the assets 559, 561, 563 in the vicinity of the pallet 550 based on receipt of one or more advertising packets from each of the nodes E, F, and G. In some embodiments, in response to receipt of advertising packets broadcasted by the peripheral nodes 558, 560, 562, the master node 551 transmits respective requests to the server to associate the master node 551 and the respective peripheral nodes 558, 560, 562. In some examples, the master tape node requests authorization from the server to associate the master tape node and the peripheral tape nodes. If the corresponding assets 559, 561, 563 are intended to be grouped together (e.g., they share the same itinerary or certain segments of the same itinerary), the server authorizes the master node 551 to associate the peripheral nodes 558, 560, 562 with one another as a grouped set of assets. In some embodiments, the server registers the master node and peripheral tape node identifiers with a group identifier. The server also may associate each node ID with a respective physical label ID that is affixed to the respective asset.

In some embodiments, after an initial set of assets is assigned to a multi-asset group, the master node 551 may identify another asset arrives in the vicinity of the multi-asset group. The master node may request authorization from the server to associate the other asset with the existing multi-asset group. If the server determines that the other asset is intended to ship with the multi-asset group, the server instructs the master node to merge one or more other assets with currently grouped set of assets. After all assets are grouped together, the server authorizes the multi-asset group to ship. In some embodiments, this process may involve releasing the multi-asset group from a containment area (e.g., customs holding area) in a shipment facility.

In some embodiments, the peripheral nodes 558, 560, 562 include environmental sensors for obtaining information regarding environmental conditions in the vicinity of the associated assets 559, 561, 563. Examples of such environmental sensors include temperature sensors, humidity sensors, acceleration sensors, vibration sensors, shock sensors, pressure sensors, altitude sensors, light sensors, and orientation sensors.

In the illustrated embodiment, the master node 551 can determine its own location based on geolocation data transmitted by a satellite-based radio navigation system 570 (e.g., GPS, GLONASS, and NAVSTAR) and received by the GPS receiver 554 component of the master node 551. In an alternative embodiment, the location of the master pallet node 551 can be determined using cellular based navigation techniques that use mobile communication technologies (e.g., GSM, GPRS, CDMA, etc.) to implement one or more cell-based localization techniques. After the master node 551 has ascertained its location, the distance of each of the assets 559, 561, 563 from the master node 551 can be estimated based on the average signal strength of the advertising packets that the master node 551 receives from the respective peripheral node. The master node 551 can then transmit its own location and the locations of the asset nodes E, F, and G to a server over a cellular interface connection with a cell tower 572. Other methods of determining the distance of each of the assets 559, 561, 563 from the master node 551, such as Received Signal-Strength Index (RSSI) based indoor localization techniques, also may be used.

In some embodiments, after determining its own location and the locations of the peripheral nodes, the master node 551 reports the location data and the collected and optionally processed (e.g., either by the peripheral nodes peripheral nodes 558, 560, 562 or the master node 551) sensor data to a server over a cellular communication path 571 on a cellular network 572.

In some examples, nodes are able to autonomously detect logistics execution errors if assets that suppose to travel together no longer travel together, and raise an alert. For example, a node (e.g., the master node 551 or one of the peripheral nodes 558, 560, 562) alerts the server when the node determines that a particular asset 559 is being or has already been improperly separated from the group of assets. The node may determine that there has been an improper separation of the particular asset 559 in a variety of ways. For example, the associated node 558 that is bound to the particular asset 559 may include an accelerometer that generates a signal in response to movement of the asset from the pallet. In accordance with its intelligent agent program code, the associated node 558 determines that the master node 551 has not disassociated the particular asset 559 from the group and therefore broadcasts advertising packets to the master node, which causes the master node 551 to monitor the average signal strength of the advertising packets and, if the master node 551 determines that the signal strength is decreasing over time, the master node 551 will issue an alert either locally (e.g., through a speaker component of the master node 551) or to the server.

Figure 10D:
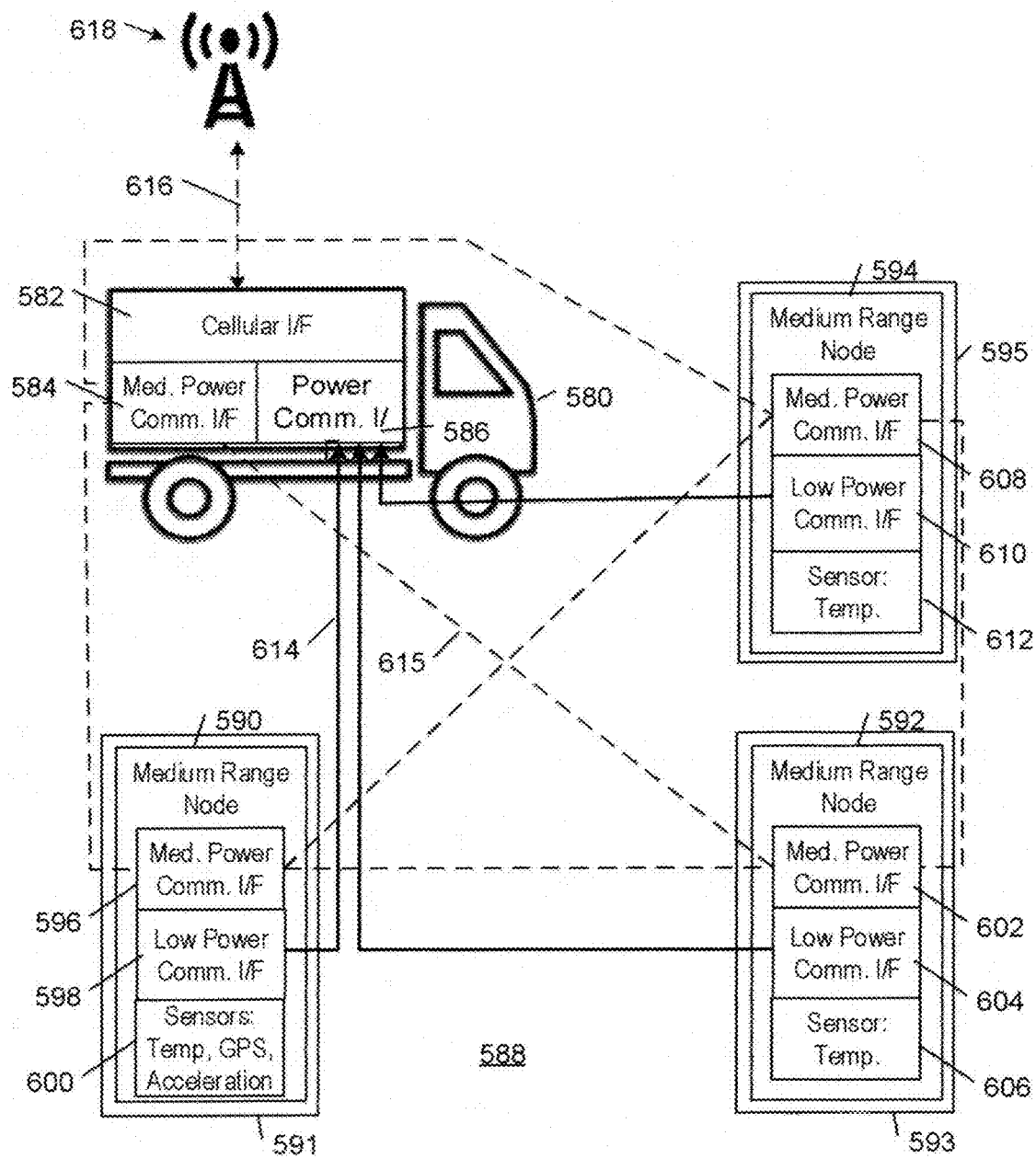

Referring to FIG. 10D, a truck 580 is configured as a mobile node or mobile hub that includes a cellular communications interface 582, a medium power communications interface 584, and a low power communications interface 586. The communications interfaces 580-586 may be implemented on one or more tape and non-tape nodes. In an illustrative scenario, the truck 580 visits a storage facility, such as a warehouse 588, to wirelessly obtain temperature data generated by temperature sensors in the medium range nodes 590, 592, 594. The warehouse 588 contains nodes 590, 592, and 594 that are associated with respective assets 591, 593, 595. In the illustrated embodiment, each node 590-594 is a medium range node that includes a respective medium power communications interface 596, 602, 608, a respective low power communications interface 598, 604, 610 and one or more respective sensors 600, 606, 612. In the illustrated embodiment, each of the asset nodes 590, 592, 594 and the truck 580 is connected to each of the other ones of the asset nodes through a respective medium power communications path (shown by dashed lines). In some embodiments, the medium power communications paths are LoRa formatted communication paths.

In some embodiments, the communications interfaces 584 and 586 (e.g., a LoRa communications interface and a Bluetooth Low Energy communications interface) on the node on the truck 580 is programmed to broadcast advertisement packets to establish connections with other network nodes within range of the truck node. A warehouse 588 includes medium range nodes 590, 592, 594 that are associated with respective containers 591, 593, 595 (e.g., assets, boxes, pallets, and the like). When the truck node's low power interface 586 is within range of any of the medium range nodes 590, 592, 594 and one or more of the medium range nodes is operating in a listening mode, the medium range node will extract the address of truck node and potentially other information (e.g., security information) from the advertising packet. If, according to its programmatic code, the truck node determines that it is authorized to connect to one of the medium range nodes 590, 592, 594, the truck node will attempt to pair with the medium range node. In this process, the truck node and the medium range node determine each other's identities, capabilities, and services. For example, after successfully establishing a communication path with the truck node (e.g., a Bluetooth Low Energy formatted communication path 614 or a LoRa formatted communication path 615), the truck node determines the identity information for the medium range node 590 (e.g., a peripheral node), the medium range node's capabilities include retrieving temperature data, and the medium range node's services include transmitting temperature data to other nodes. Depending of the size of the warehouse 588, the truck 580 initially may communicate with the nodes 590, 592, 594 using a low power communications interface (e.g., Bluetooth Low Energy interface). If any of the anticipated nodes fails to respond to repeated broadcasts of advertising packets by the truck 580, the truck 580 will try to communicate with the non-responsive nodes using a medium power communications interface (e.g., LoRa interface). In response to a request from the truck node 584, the medium range node 590 transmits an indication of its measured temperature data to the truck node. The truck node repeats the process for each of the other medium range nodes 592, 594 that generate temperature measurement data in the warehouse 588. The truck node reports the collected (and optionally processed, either by the medium range nodes 590, 592, 594 or the truck node) temperature data to a server over a cellular communication path 616 with a cellular network 618.

Figure 10E:
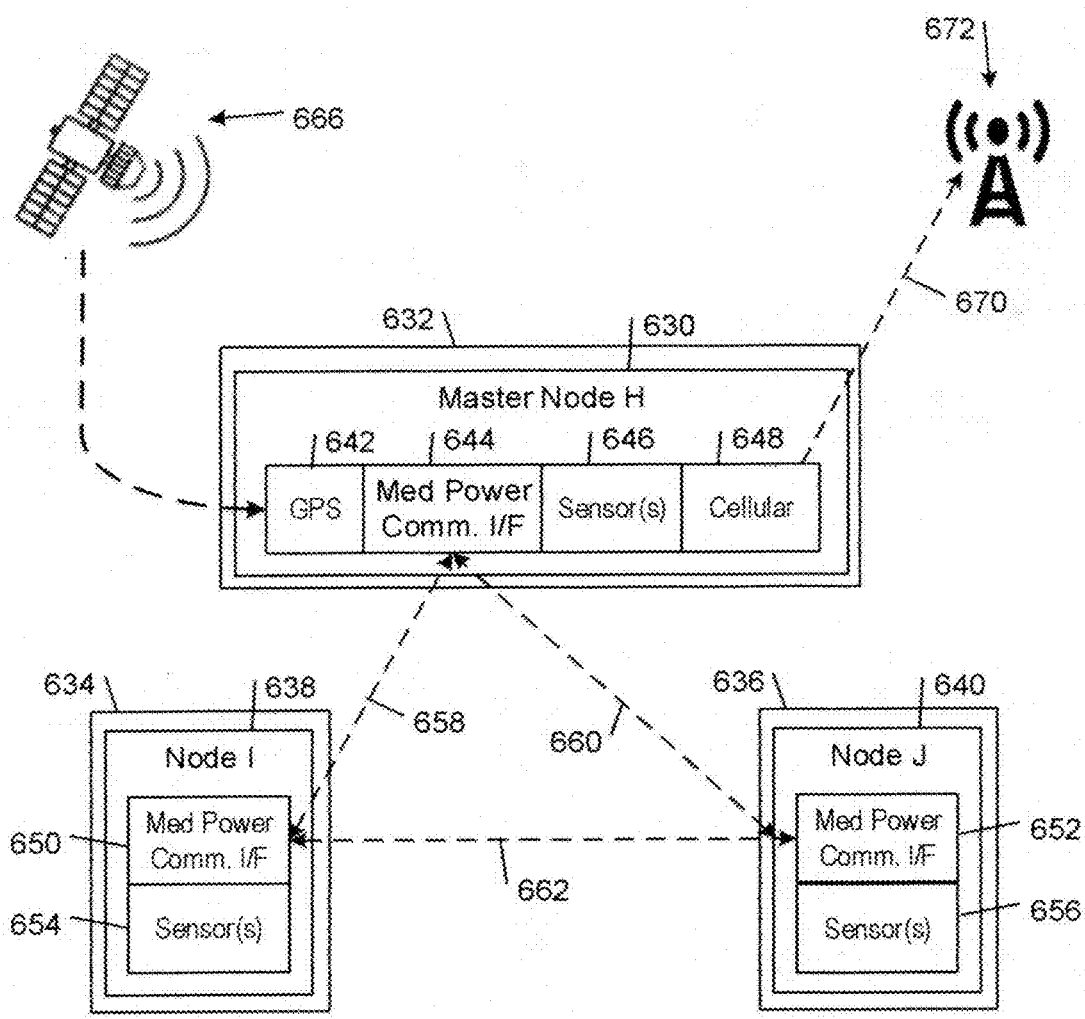

Referring to FIG. 10E, a master node 630 is associated with an item 632 (e.g., an asset) and grouped together with other items 634, 636 (e.g., assets) that are associated with respective peripheral nodes 638, 640. The master node 630 includes a GPS receiver 642, a medium power communications interface 644, one or more sensors 646, and a cellular communications interface 648. Each of the peripheral nodes 638, 640 includes a respective medium power communications interface 650, 652 and one or more respective sensors 654, 656. In the illustrated embodiment, the peripheral and master nodes are connected to one another other over respective pairwise communications paths (shown by dashed lines). In some embodiments, the nodes 630 638, 640 communicate through respective LoRa communications interfaces over LoRa formatted communications paths 658, 660, 662.

In the illustrated embodiment, the master and peripheral nodes 638, 638, 640 include environmental sensors for obtaining information regarding environmental conditions in the vicinity of the associated assets 632, 634, 636. Examples of such environmental sensors include temperature sensors, humidity sensors, acceleration sensors, vibration sensors, shock sensors, pressure sensors, altitude sensors, light sensors, and orientation sensors.

In accordance with the programmatic code stored in its memory, the master node 630 periodically broadcasts advertising packets in the surrounding area. When the peripheral nodes 638, 640 are within range of master node 630, and are operating in a listening mode, the peripheral nodes 638, 640 will extract the address of master node 630 and potentially other information (e.g., security information) from the advertising packets. If, according to their respective programmatic code, the peripheral nodes 638, 640 determine that hey are authorized to connect to the master node 630, the peripheral nodes 638, 640 will attempt to pair with the master node 630. In this process, the peripheral nodes 638, 640 and the master node and the peripheral nodes determine each other's identities, capabilities, and services. For example, after successfully establishing a respective communication path 658, 660 with each of the peripheral nodes 638, 640 (e.g., a LoRa formatted communication path), the master node 630 determines certain information about the peripheral nodes 638, 640, such as their identity information (e.g., peripheral nodes), their capabilities (e.g., measuring temperature data), and their services include transmitting temperature data to other nodes.

After establishing LoRa formatted communications paths 658, 660 with the peripheral nodes 638, 640, the master node 630 transmits requests for the peripheral nodes 638, 640 to transmit their measured and/or locally processed temperature data to the master node 630.

In the illustrated embodiment, the master node 630 can determine its own location based on geolocation data transmitted by a satellite-based radio navigation system 666 (e.g., GPS, GLONASS, and NAVSTAR) and received by the GPS receiver 642 component of the master node 630. In an alternative embodiment, the location of the master node 630 can be determined using cellular based navigation techniques that use mobile communication technologies (e.g., GSM, GPRS, CDMA, etc.) to implement one or more cell-based localization techniques. After the master node 630 has ascertained its location, the distance of each of the assets 634, 636 from the master node 630 can be estimated based on the average signal strength of the advertising packets that the master node 630 receives from the respective peripheral node. The master node 630 can then transmit its own location and the locations of the asset nodes E, F, and G to a server over a cellular interface connection with a cell tower 672. Other methods of determining the distance of each of the assets 634, 636 from the master node 630, such as Received Signal-Strength Index (RSSI) based indoor localization techniques, also may be used.

In some embodiments, after determining its own location and the locations of the peripheral nodes, the master node 630 reports the location data the collected and optionally processed (e.g., either by the peripheral nodes peripheral nodes 634, 636 or the master node 630) sensor data to a server over a cellular communication path 670 on a cellular network 672.

Context-Based Data Compression and Reconstruction

A significant problem with industrial IoT systems is power consumption of wireless device nodes that are battery powered. Wireless nodes typically need to communicate data frequently, and each communication consumes electrical power and other communication resources. In order to conserve battery power, the disclosed method and wireless IOT system thereof identifies what data to selectively communicate between the wireless nodes to minimize the amount of data communicated, while still maintaining the functionality of the wireless IOT system in performing industrial IOT applications or tasks. Example methods discussed below for dynamic compression of data include lossless compression, lossy compression, and lossy compression using contextual information. In some of these methods, a portion of the data is discarded to save battery life, but based on contextual information that was transmitted up to the network, the missing data can be partially or completely reconstructed by the recipient.

Figure 11A:
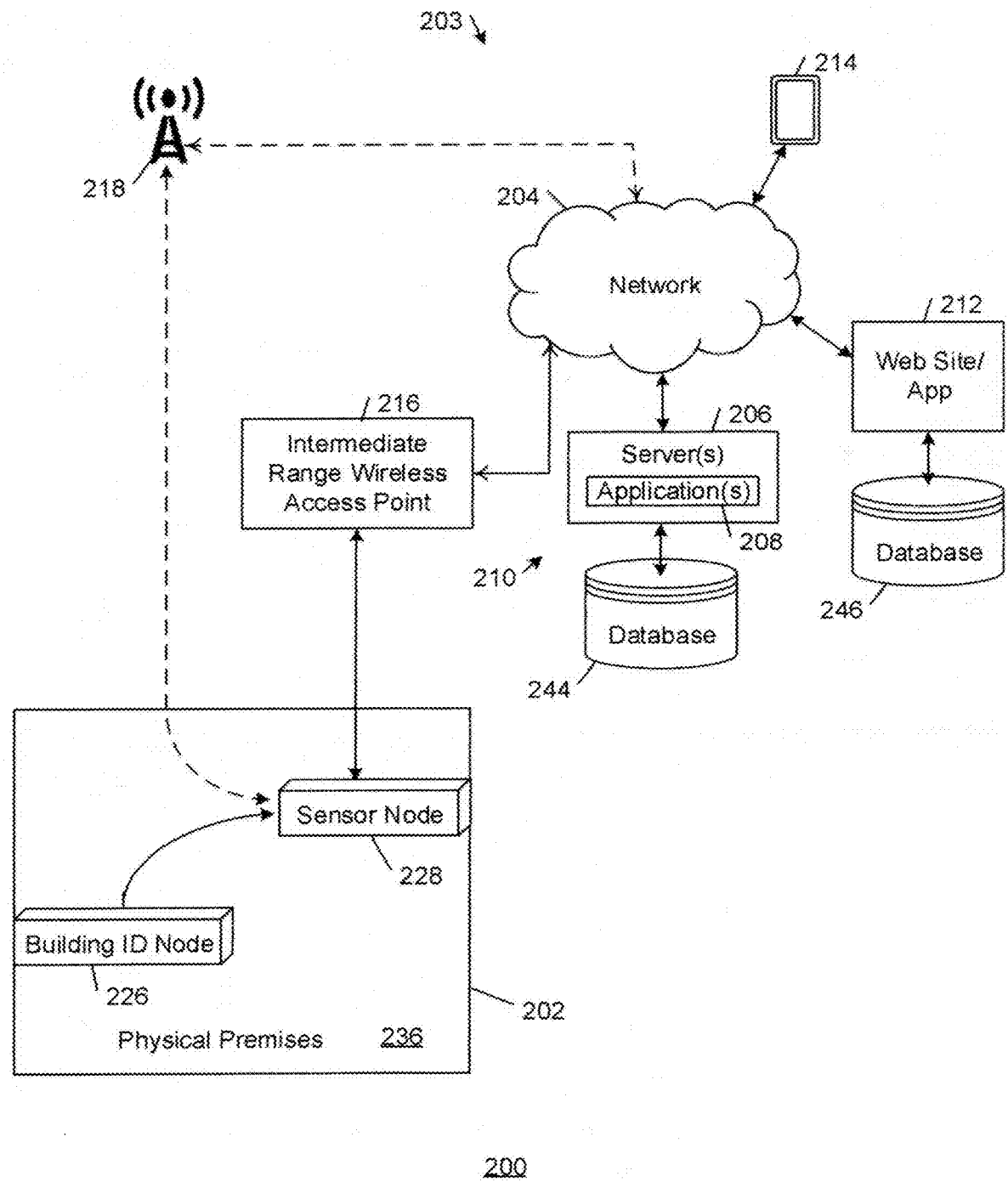
FIG. 11A shows an example of a network communications environment 200 that includes an architectural platform 202 on which a wide variety of different wireless IOT applications can be implemented, including, for example, industrial internet-of-things applications.

FIG. 11A shows an example of a network communications environment 200 that includes an architectural platform 202 on which a wide variety of different wireless IOT applications can be implemented, including, for example, industrial internet-of-things applications. In the illustrated embodiments, the architectural platform 202 is a platform implemented in physical premises 236 that may include a plurality of wireless nodes. The physical premises 236 are an area where the IOT application is being used, according to some embodiments. For example, the physical premises 236 is a building including a number of tape nodes for tracking the location and environmental condition of assets inside the building. The architectural platform 202 may be connected to a distributed network service infrastructure 203. Part of the distributed network service infrastructure 203 may be housed in the physical premises 236, according to some embodiments. For example, the intermediate range wireless access point 216 may be physically located on the physical premises 236 or within a threshold distance from the physical premises 236.

The distributed network service infrastructure 203 includes a network 204 (e.g., the internet) that supports communications with one or more servers 206 executing one or more applications 208 of a network service 210, a web site/app 212 associated with the network service 210, a computing device 214 (e.g., a mobile phone, a tablet or laptop computer, or the like), and optionally one or more access points including an intermediate range wireless access point 216 (e.g., a LoRaWAN) and a cellular access point 218. In some examples, the distributed network service infrastructure includes one or more network communication systems and technologies, including any one or more of wide area networks, local area networks, public networks (e.g., the internet), private networks (e.g., intranets and extranets), wired networks, and wireless networks. The distributed network service infrastructure also may include communications infrastructure equipment, such as a geolocation satellite system (e.g., GPS, GLONASS, and NAVSTAR), cellular communication systems 218 (e.g., GSM/GPRS), communication systems, and RF communication systems 216 (e.g., LoRaWAN).

In the illustrated example, the network service 210 includes a user application 208 that executes on a client device 214 to enable an administrator of the network service 210 to configure and retrieve status and sensor data from components (e.g., wireless network devices, also referred to as "network nodes") of the transient network infrastructure in the physical premises 236. The disclosed embodiments utilize different types of network nodes to collect data from the physical premises 236, including master network nodes, intermediate, and peripheral network nodes. Examples of the types of data that may be collected by the network nodes include asset status information, event data, and sensor data (e.g., temperature data, acceleration data, location data, etc.). The network service 210 stores in an end-user database 244 user account information and data obtained from the master node 220 and the peripheral nodes 222-226. In the illustrated example, users of the network service 210 may utilize a web browser application to access the web site/app 212, which provides access to a database 246 that stores end-user data for each user of the web site/app 212. In the example shown in FIG. 9, users can access the web site/app 212 to obtain information regarding, for example, the shipping status, location, and/or condition of relevant assets or parcels, as well as other information concerning the users' assets, parcels, and other items.

In general, the network infrastructure can be implemented by a wide variety of wireless network nodes. In some embodiments, the network infrastructure includes various types of tape nodes in the physical premises 236, including a master tape node 220, one or more intermediate tape nodes, and peripheral tape nodes 222, 224, 226. In some examples, multiple classes or types of tape nodes are used to implement a particular application, where each tape node class has a different respective set of roles, functionalities and/or capabilities. In some examples, the master node and peripheral tape nodes communicate in the physical premises over local channels implemented using low-power wireless communications interfaces, such as a Bluetooth communication interface (e.g., a Bluetooth Low Energy system), a Z-wave communication interface, and a ZigBee communication interface.

Communication across the network communications environment 200 is secured by a variety of different security mechanisms. In the case of existing infrastructure, a communication link uses existing infrastructure security mechanisms. In the case of communications among tapes nodes, communication is secured through a custom security mechanism. In certain cases, tape nodes can also be configured to support block chain based security measures that protect the transmitted and stored data.

The physical premises 236 may be, for example, any location in which there are persons, places or things to be monitored, tracked, sensed, or inventoried, including any building or structure, such as a warehouse, a distribution center, a manufacturing establishment, a supplier establishment, a customer establishment, a retail establishment, a restaurant, an apartment building, a hotel, a house, or other dwelling or defined space.

In the illustrated embodiment, the physical premises 236 includes a building ID node 226 and a sensor node 228. In some embodiments, the building ID node transmits the building ID into the physical premises 236. The sensor node 228 and other suitably configured nodes are configured to communicate with the building ID node in the physical premises 236. After receiving the building ID from the building ID node, the sensor node 228 stores the building ID in memory; however, the sensor node 228 doesn't send the building ID to the network 204. Instead, a lookup table for contextual information is generated to map the sensor node address to the building ID in the network 204. In this way, the sensor node 228 does not have to send the building ID to the network 204, thereby avoiding the substantial loss of battery charge that otherwise would have occurred if the sensor node 228 had to send the building ID to the cloud 204 for each communication to the cloud.

Figure 11B:
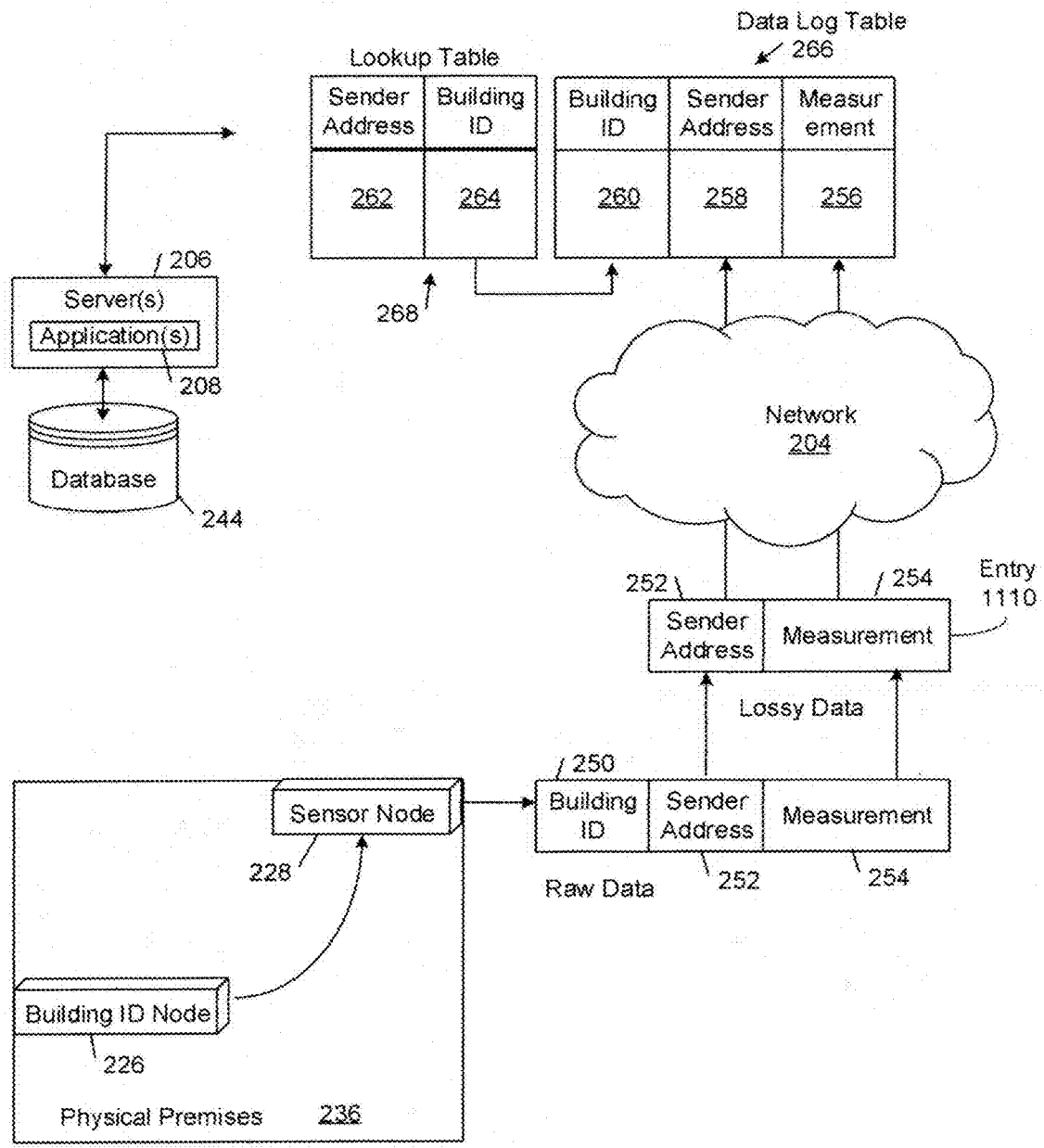
FIG. 11B is a diagram showing an example of context-based data compression and reconstruction in the network communication environment 200 shown in FIG. 11A, according to some embodiments.

FIG. 11B is a diagram showing an example of context-based data compression and reconstruction in the network communication environment 200 shown in FIG. 11A, according to some embodiments. FIG. 11B shows the physical premises 236, the network 204, and some portions of the distributed network service infrastructure 203. In the illustrated example of FIG. 11B, the physical premises 236 is a building where a building ID node 226 and a sensor node 228 are located. Remote from the physical premises are one or more servers 206 and a database 244 of the distributed network service infrastructure 203, also referred to herein as the "IOT system controller" 203 or "the cloud" 203. FIG. 11B illustrates the data flows that enables substantial battery and communication resource savings that are obtained by storing one or more lookup tables in the cloud 203.

In operation, the sensor node 228 stores raw sensor/measurement data 254 and other data in a memory of the sensor node 228. In this example, the raw data includes a full sender address, the full sender address including the building ID 250 and the sender address 252, and the measurement data 254. According to the disclosed method of context-based compression, the sensor node 228 truncates portions of the raw data, before transmitting the truncated data to other nodes of the wireless IOT system. When the truncated data is relayed up to the cloud 203 via the network 204, the truncated data is reconstructed in the cloud using context-based reconstruction. In some embodiments, the sensor node 228 is configured to discard the building ID 250 and send the sender address 252 and the measurement data 254 up to the cloud 203. When sending data up to the network 204, the sensor node 228 may directly transmit the data up to cloud 203 via the network 204, according to some embodiments. In other embodiments, the sensor node 228 may transmit the data to another node of the wireless JOT system (e.g., a tape node, a gateway device, a client device, some other node, or some combination thereof) over a short range or local communication channel (e.g., a Bluetooth or WiFi connection). The other node, in turn, relays the data up to the cloud 203 via a long range or wide area network connection (e.g., via the internet), or by relaying again to other nodes in the wireless IOT system.

In the cloud 203, the truncated data is reconstructed using contextual information. In the illustrated embodiment, the contextual information is stored in the database 244 in a lookup table 268. When reconstructing the data in the cloud 203, the server application 208 accesses the lookup table 268 stored in the database 244. The lookup table includes building IDs 264 that are correlated with sender addresses 262. In some embodiments, the data in the lookup table 268 is established at an initialization step for the wireless nodes in the wireless IOT system. For example, when the sensor node 228 is initialized and deployed for its application in the physical premises 236, the wireless node may transmit the building ID 250 and the sender address 252 up to the cloud for storage in the database 244. In subsequent transmissions, the sensor node 228 may only send the sender address 252 without the building ID 250 to save battery and communication resources. In the illustrated example, the sensor node 228 sends the sender address 252 and the sensor/measurement data 254 when sending data transmissions up to the cloud 203 as part of its industrial IOT application. The received data at the cloud 203 is stored respectively as an entry 1110 (represented as a row of the data log table 266) in the data log table 266 with the sender address 252 for entry 1110 stored in the sender address column 258 of table 266 and the measurement for entry 1110 stored in the measurement column 256 of table 266. The table 266 may be used for performing functions of the industrial IOT application, such as analyzing the measurement data. Without the full sender address, an application or node of the wireless JOT system accessing the entry 1110 in table 266 may not be able to resolve which node actually provided the data for the entry 1110. In order to reconstruct the full sender address, the server 206 accesses the lookup table 268 and retrieves the corresponding entry for the building ID stored in column 262 in the table 268. The server 206 then appends the respective building ID to the entry 1110 in the building ID column 260 of the data log table 266. In this way, the sensor node 228 can conserve battery power and communication resources by reducing the amount of data transmitted during data transmissions, without any loss of information by utilizing the context-based reconstructing of the association between the sender address 262 and the building ID 264 in the cloud 203.

Figure 11C:
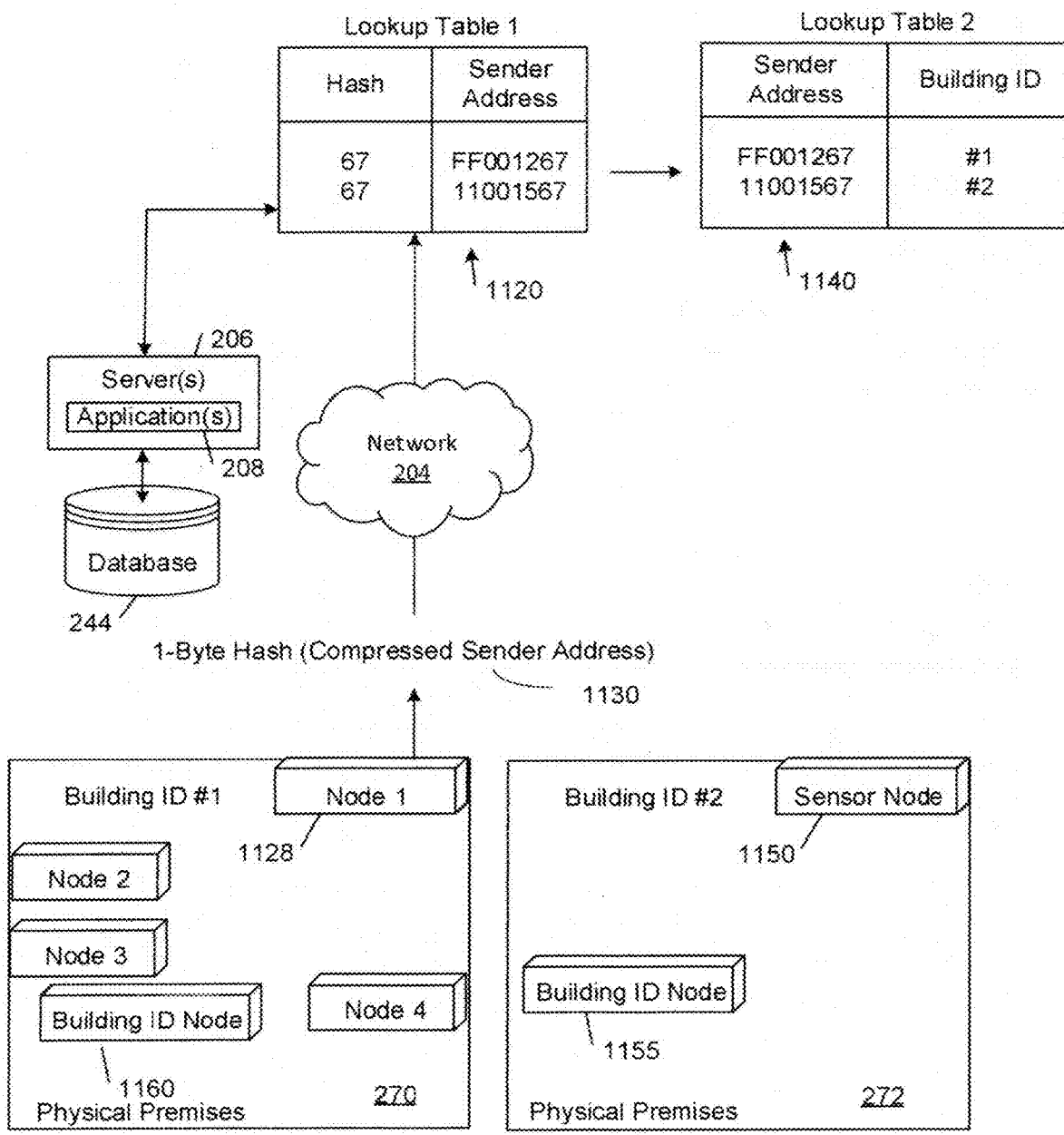
FIG. 11C shows another embodiment of context-based data compression and reconstruction, according to some embodiments.

FIG. 11C shows another embodiment of context-based data compression and reconstruction, according to some embodiments. In the example of FIG. 11C, the environment and platform are similar to that shown in FIG. 11B, except that the example in FIG. 11C includes more than one physical premises. In the illustrated embodiments, the physical premises include two buildings, building 270 and building 272. However, in other embodiments, the physical premises may include more than two buildings or locations. Building 270 is associated with the Building ID #1, and building 272 is associated with Building ID #2. In one example, there are four different sender nodes (node 1, node 2, and node 3) in building 270, and each sender node is associated with Building ID #1. The association may occur similarly to the example shown in FIG. 11B, where a building ID node 1160 sends the building ID to each sender node (Node 1, Node 2, Node 3, and Node 4). In the shown embodiment, each sender node has a full sender address which includes a four-byte sender address and a building ID. When sending data up to the cloud 203 the sender node truncates the full sender address by omitting the building ID and converting the four-byte sender address into a one-byte hash 1130. Instead of the full sender address which includes the associated building ID (i.e., Building ID #1) and the four-byte sender address, the sender node 1128 (Node 1) only sends the one-byte hash 1130 when sending data up to the cloud 203. While the example shown in FIG. 11C shows the sender addresses as being four-bytes long and the converted hash 1130 being one-byte long, this is for the sake of illustration and the sender address may be longer than or shorter than four-bytes long. Similarly, the converted hash is shorter than the sender address, but may be longer than or shorter than four-bytes long, depending on the length of the sender address.

In particular, a sender node 1128 (i.e., Node 1) starts with the 4-byte sender address and compresses the sender address by creating a hash 1130 using a hash function with the 4-byte sender address as an input to the hash function. For illustrative purposes, in the example of FIG. 11C, the hash function simply produces a hash which is the last byte of the four-byte sender address provided as an input. In other embodiments, the hash function is a different function that produces a hash of shorter length than the input sender address. The node 1128 transmits this hash 1130 with any data transmissions up to the cloud 203 in lieu of the full sender address, greatly reducing the bandwidth and energy cost of data transmissions that require the node's sender address. In the illustrated example, the sender node 1128 has a four-byte sender of address corresponding to FF001267 in hexadecimal. The generated one-byte hash 1130 is 67 in hexadecimal.

The hash 1130 is received at the cloud 203, and the server 206 reconstructs the full sender address of the sender node 1128 using the first lookup table 1120 and the second lookup table 1140. The first lookup table 1120 and the second lookup table 1140 are stored on the database 244 and accessed by the server 206 when reconstructing the full sender address. The first lookup table 1120 includes entries of 4-byte sender addresses for all known wireless nodes in the wireless IOT system (e.g., Node 1, Node 2, Node 3, Node 4, and sensor node 1150) and their corresponding hashes. The server retrieves all possible entries in the first lookup table 1120 (shown in FIG. 11C) that include the received hash. If only one entry exists that includes the received hash, the four-byte sender address may be reconstructed based on the retrieved entry. However, there is a risk of aliasing if there are more than one entry that includes the received hash. In the example shown in FIG. 11C, two entries in the first lookup table 1120 include the received hash (i.e., two sender addresses correspond to the one-byte hash). The four-byte sender addresses FF001267 and 11001567 in hexadecimal correspond to the hash of 67 in hexadecimal. The four-byte sender address of 11001567 corresponds to the sender address of sensor node 1150 associated building 272 (with Building ID #2). As explained below, the server 206 performs anti-aliasing using the second lookup table 1140 and retrieved contextual information to resolve the correct four-byte sender address.

Contextual information is used to resolve aliasing issues. In an example, the original four-byte sender address for sender node 1128 is FF001267, where the hash is simply the last byte of the sender address (i.e., "67"). But if a wireless node (i.e., sensor node 115) has an original four-byte sender address of 11001567, the hash is also "67". In operation, node 1128 (Node 1) in building 1 communicates the hash "67" up to the cloud 203. At this point, it is not possible to determine to know which is the correct original sender address that corresponds to the hash "67" without contextual reconstruction. In particular, contextual information regarding the building from which the sender node transmitted the data (e.g., building #1 or building #2) is used to perform antialiasing. The server 206 determines which building the data was transmitted from and accesses the second Lookup Table 1140. The second lookup table 1140 includes a four-byte sender address and an associated building ID for each wireless node in the wireless IOT system. By accessing the associated building IDs for the ambiguous sender addresses (e.g., FF001267 and 11001567) corresponding to the received hash 1130, the server 206 is able to resolve the correct sender address. The lookup table 1140 may be built during an initialization step for each wireless node, as similarly described above in reference to sensor node 1128 in FIG. 11B. In the illustrated embodiment, the sender node address FF001267 corresponds to a wireless node associated with the building ID #1, and the sender node address 11001567 is associated with the building ID #2. Based on knowing which building the sender node 1128 is in, the server identifies that the sender node address must be FF001267.

The server 206 may determine which building the sender node 1128 is in, based on retrieved contextual information. In some embodiments, the sender node transmits the contextual information up to the cloud 203. For example, if the contextual information can be encoded in data that is of smaller size than the omitted or truncated parts of the full sender address, the sender node 1128 may transmit the hash along with the contextual information and still reduce the amount of data transmitted when compared to sending the full sender address. In a further embodiment, the sender node 1128 transmits the hash together with the building ID up to the cloud 203, and the server 206 performs the anti-aliasing based on the received building ID.

In other embodiments, the contextual information is retrieved without the sender node 1128 transmitting it. In further embodiments, the contextual information is stored in the database 244 and accessed when performing the anti-aliasing. For example, the building ID may be associated with one or more IP addresses. If the server detects that the data including the hash 1130 is transmitted from a device or network with an IP address associated with the building ID #1, the server 206 determines that the sender node 1128 is in the building 270 (building ID #1). In other embodiments, the building ID of the sender node is determined based on a schedule for receiving expected data communications. For example, all wireless nodes (e.g., node 1, node 2, node 3, and node 4) in building 270 (Building ID #1) are scheduled to send data up to the cloud between 2 PM and 3 PM every day, whereas all nodes in building 272 (Building ID #2) are scheduled to send data up to the cloud between 6 PM and 7 PM every day.

Other contextual information than those described above may be used to perform anti-aliasing and reconstruction of data transmitted from wireless nodes in the wireless IOT system.

In some embodiments, the data sent by the sender node is relayed by a gateway device. For example, the sender node may transmit the data to a gateway node using Bluetooth, and the gateway node may use a cellular communication connection to relay the data up to the cloud. In this case, the gateway node may not have limited communication resources (e.g., the gateway node may receive electrical power through an electrical line). The gateway node may transmit the received data from the sender node along with an amount of contextual information, such as an uncompressed or non-truncated version of the gateway node's own address (or hardware identifier). The server may receive the data from the gateway node and determine the building identifier associated with the sender node based on the received gateway node address. For example, the server may access a database which correlates building identifiers to gateway node addresses for each gateway node in the wireless IOT system. In another example, the contextual information provided by the gateway node may include a log of wireless node interactions that the gateway node has recorded. In this case, the server may reconstruct the full sender node address based on historical records provided by the gateway node. In this way, the sender node may perform a high level of compression, where the reconstruction is aided by the gateway node. Further, the gateway node may append data with lower or no compression to the data received from the sender node and provide that data package to the server. Thus, the sender node which has limited communication resources may still conserve its resources, while the system minimizes any loss of information due to the aid of the gateway node.

In other embodiments, the sender node may be configured to communicate its data on a unique frequency spectrum. In this case, the server may detect which frequency spectrum the data was transmitted from and reconstruct the full sender address for the sender node based on knowing the unique frequency spectrum. For example, the server may access a database which correlates sender node addressees or building identifiers to various frequency spectra.

In other embodiments, the contextual information may be based on a known flow of traffic for assets or other objects being tracked by the wireless IOT system. For example, if the data transmitted with the sender address includes location data, the location data may be used to reconstruct the full sender address. In the case where the location data indicates a location for an asset as being a large distance away from a physical premise, the server may rule out sender nodes that are in that physical premise when performing the anti-aliasing.

Other contextual information may be based on measurement or sensor data that is received alongside the sender address. For example, if temperature data is sent along with the sender address, the temperature data may be used in the anti-aliasing process. In a case where temperature data is above a threshold value, the server may rule out sender nodes that are located in refrigerated areas when performing the anti-aliasing.

Dynamic Compression of Analog Data

FIGS. 12A-12F show example diagrams illustrating a method of processing analog data using lossy compression to conserve communication resources used in wireless communications devices (i.e., wireless nodes) in a wireless IOT system. The wireless nodes include industrial IoT nodes, such as wireless tape nodes. In some embodiments, the process involves converting the raw analog data into lossy compressed data, reconstructing particular data of interest, and producing final results.

Figure 12A:
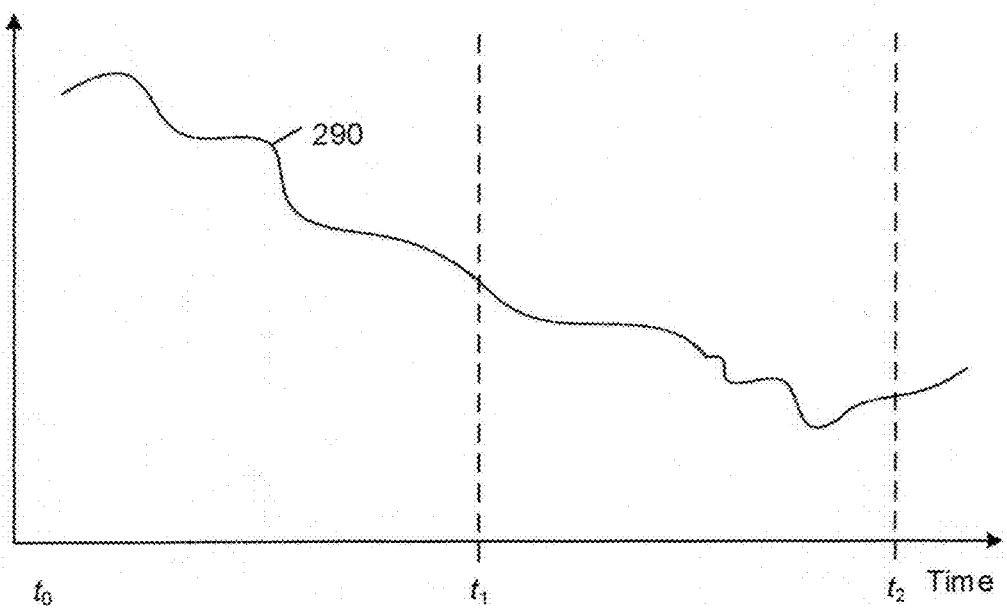
FIGS. 12A-12F show example diagrams illustrating a method of processing analog data using lossy compression to conserve communication resources used in wireless communications devices (i.e., wireless nodes) in a wireless IOT system, according to some embodiments.

FIG. 12A shows a graph of an exemplary analog data measurement 290 over a period of time. The analog data is collected by a sender node, such as the sensor node 228 shown in FIGS. 11A and 11B. In the illustrated example, the analog data is temperature sensor data, but in other embodiments the analog data may represent other kinds of sensor data. In some examples, the analog data measurement may be any type of measurement such as a measurement that can be presented as a diagram showing the relation between variable quantities. For example, in the illustrated embodiment, the data measurement is temperature as a function of time. In some examples, the sender node measures statistical data characterizing the analog data measurement including, for example, maximum values, minimum values, standard deviations, means, mediums, etc. In the following examples, the maximum and minimum statistics are used to illustrate the method of processing analog data.

Figure 12B:
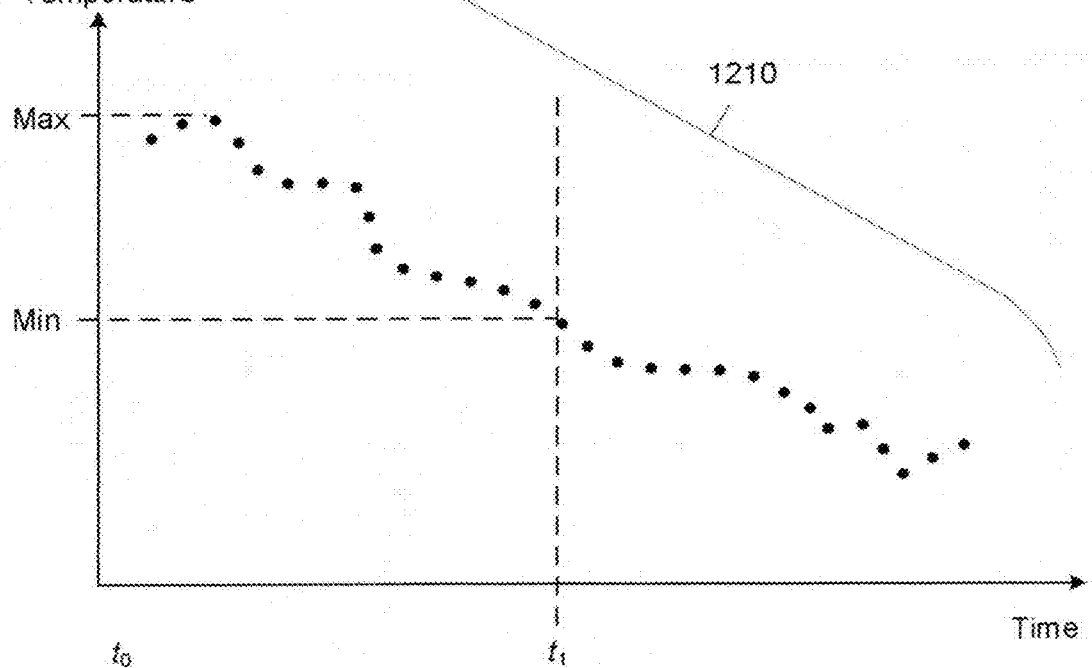

FIG. 12B shows representations of sampled and dynamically compressed data 1210 that were generated from the analog data measurement by performing dynamic, context-based compression, according to some embodiments. The digital measurement values are divided into two discrete time periods, each containing 15 sampled data points. The first time period is between times $t_0$ and $t_1$, and the second time period is between times $t_1$ and $t_2$. For each time period, the sender node dynamically compresses the analog data within the time period and transmits the compressed data up to the cloud. The compressed version of the data has a finite width (e.g., 8 bits) which allows for the conserving of battery and communication resources for the sender node, the smaller the width of the compressed data. For each time period, the full width of the compressed data is used to represent the data points in the respective region along with an offset value.

In the following example, the sender node transmits compressed digital data corresponding to the analog measurements 290 collected in the first period, applying dynamic compression of the sampled data 1210 to generate the compressed digital data. In the present example, the width of the compressed data is 8-bits. The sender node determines the min and max values for the analog data 290 that occurs during the first period, and temperature values between the min and max temperature (shown in FIG. 12B) are quantized by assigning 256 discrete digital values for the range of temperatures between the min and max temperature. For example, the range between the min and max may be divided into 256 bins. Each bin is assigned one of the 256 discrete digital values. In the embodiment shown in FIG. 12B the width of bins are equal. For example, if the max temperature is 355 Kelvin and the min temperature is 100 Kelvin, each bin is 1 Kelvin wide. The analog data 290 is then sampled, and each sampled analog data point is quantized by converting it to one of the 256 discrete digital values (referenced by an 8-bit data value) based on the sampled data point being within a respective bin. When transmitting a compressed digital data point up to the cloud 203 that corresponds to an analog datapoint, the sender node transmits the 8-bit data value along with an offset data value. The offset data value provides a contextual reference value that allows a server to reconstruct an approximate analog value. In some embodiments, the offset data value is based on a statistical measurement of the data in the respective time period. For example, the offset value may be the mm value for the first time period. In other embodiments, the offset value may be an average, a median value, a standard deviation, a root square mean, a max, or some other statistical measure. In the case of the offset being the min, the approximate analog value $T_{recon}$ is reconstructed by the following formula:

$$T_{recon} = T_{quant} + T_{offset} \quad (1)$$

Where, $T_{quant}$ is the temperature value corresponding to the compressed digital data that is transmitted by the sender node and $T_{offset}$ is the temperature value corresponding to the offset value. In the above example, where the bins have qual width, the $T_{quant}$ value may equal the width of the bin times the integer representation of the digital data point. In some embodiments, the sender node may send data that describes the bin sizes up to the cloud 203 when sending the compressed data.

The sender node is configured to perform the dynamic compression for each time period, according to some embodiments. Thus in the illustrated embodiments of FIGS. 12A and 12B, during the second time period, the dynamic compression and quantization is repeated. In the second time period, new max and min values will be determined by the sender node. The dynamic quantization for the data values in the second time period will then be based on the new max and min values. Thus, a compressed digital data value transmitted for the second time period may correspond to a different temperature when reconstructed than a reconstructed temperature for the same digital data value that is transmitted for the first time period.

Figures 12C, 12D:
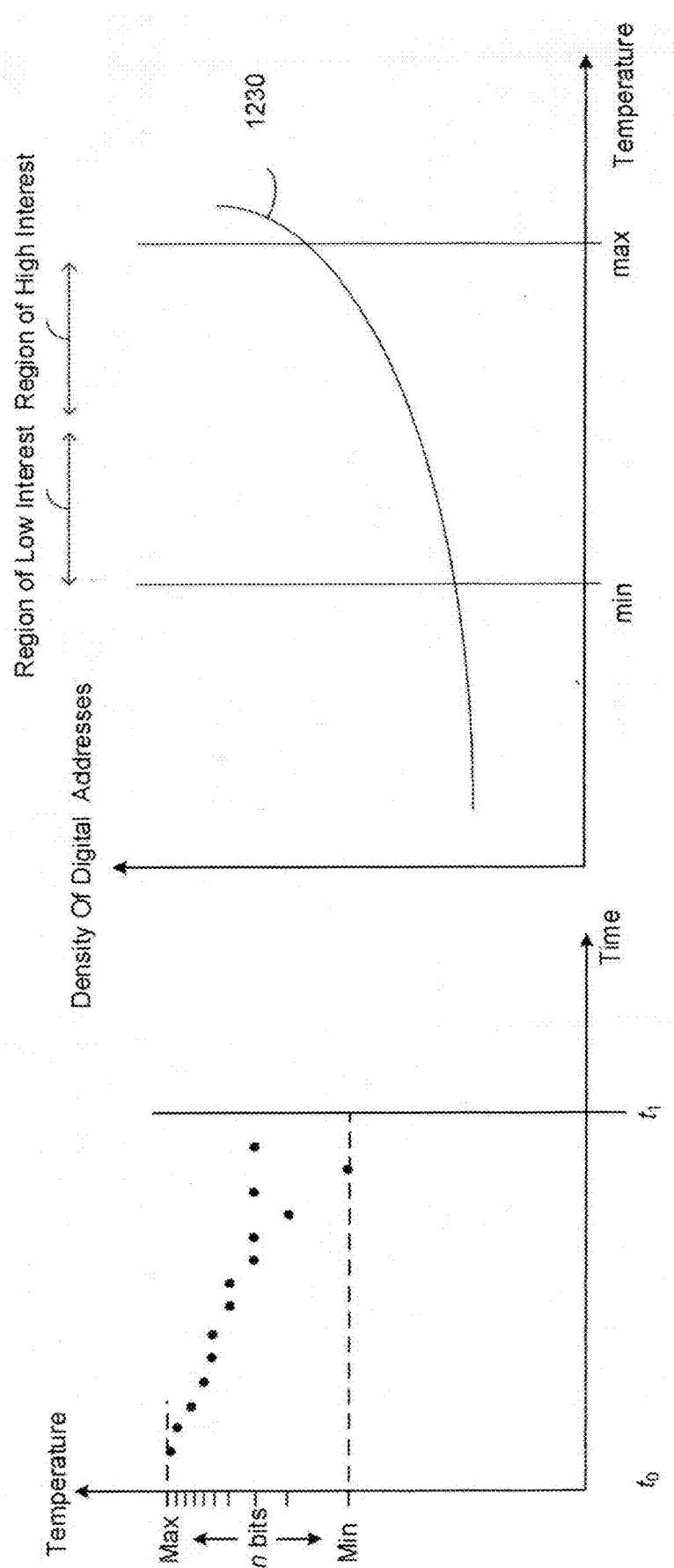

FIG. 12C shows another example graph of a sampled and dynamically compressed data representation of the analog data 290 from FIG. 12A in the first time period, according to some embodiments. In the example of FIG. 12C, the width of the bins for quantization are not equal for each digital data point representation. Instead, the width of the bins is based on a data range of interest, with a first data range of interest having a higher data resolution than a second data range. In the example shown in FIGS. 12C and 12D, for temperatures closer to the max temperature for the first time period, more of the discrete digital values are used to describe the temperatures. In other words, for a digital data value, the closer to the max temperature the respective bin is, the smaller the bin will be. This is illustrated by the graph in FIG. 12D which shows the density of digital addresses versus temperature, according to some embodiments. The density of digital addresses is a density of available quantized data points for describing temperature at the respective temperature. The sender node may be configured to perform the dynamic compression of data for each time period based on a curve, such as the curve 1230, according to some embodiments. The sender node may store the curve on a memory of the sender node and access the curve when performing the dynamic compression.

Other compression and quantizing methods may be used other than those shown in FIGS. 12A-12D In some embodiments, data transmissions are further compressed by using context-based data transmissions. In one embodiment, if the digital data representation for a data point is the same as the most recently transmitted data point, instead of sending the compressed or raw data, the sender node sends a "same" data signal up to the cloud 203. The "same" data signal may be of a smaller data length, and thus require less battery and communication resources to transmit for the sender node. The server may receive the "same" data signal and simply reconstruct the analog data approximation based on the previously transmitted and reconstructed data value.

In other embodiments, when the sensor value corresponding to the present data point is substantially similar (i.e. within a threshold distance from) to the sensor value corresponding to the previously transmitted data point, the sender node may not transmit any data up to the cloud. Instead, the sender node only transmits data when an excursion from the previous value (or a predetermined baseline value) occurs. For example, if the present analog value exceeds a threshold distance from the previous value (or the predetermined baseline value), then the sender node transmits the compressed data. In this case, the server is aware that it will only receive data transmissions for the sensor values when an excursion occurs and determines that the current value of the sensor data is the same as a previously received data point (or a predetermined baseline).

In other embodiments, the offset value is not based on a statistical value (e.g., min or max), but is based on the most recent data transmission from the sender node. For example, the compressed digital data that is transmitted may represent a displacement of the current data point from the last transmitted data point. In other words, $T_{NEW} = T_{OFFSET} - T_{DISPLACEMENT}$. Similarly to the above example, the server reconstructs the data using the previously received data point.

While temperature is used in the examples of FIGS. 12A-12F, an analog data measurement in the context of the present disclosure may be any type of continuously variable physical quantity, for example, spatial position, temperature, audio files, frequency, pressure, vibrational amplitude, voltage, or some other physical quantity. The compressed data transmitted by the sender node, in the embodiments discussed with reference to FIGS. 12A-12F, are lossy. However, using the dynamic compression and reconstruction for regions of interest, discussed with respect to FIG. 12D, allows for minimizing the loss of information in regions of high interest or sensitivity. Thus, for a specific application, the power and communication resource consumption of a sender node can be reduced while the amount of information loss is controlled for critical types of information. In contexts, where knowing that the data is in a specific range (e.g., is in a low temperature range) is more important or insightful to a user than knowing the specific temperature with a high degree of precision, the dynamic compression allows for valuable conservation of wireless node resources. By allowing for higher specificity in regions of interest (e.g., by allowing higher resolution and less information loss for higher temperatures) where a user may need to have more precision for an application, the amount of "critical" information loss due to compression is reduced.

In some embodiments, context-based compression and reconstruction can be used for sensor measurements, similar to the example of sender address compression and reconstruction discussed above with respect to FIGS. 11A-11C. For example, if a temperature measurement in a wireless IOT system is represented by a four-byte digital value, a sender node may truncate the digital value representing a temperature based on the context of the sender node. In some embodiments, the possible sensor measurements are limited by the environment or physical premises for the sender node. For example, in the case of temperature, the temperature may be limited to possible ambient temperatures which fall between 0 degrees Celsius and 50 degrees Celsius. Based on this, the sender node may generate a hash for the temperature data and transmit only the hash (e.g., the last two bytes of the digital value). The server will then reconstruct the temperature based on the hash and the knowledge that the temperatures are limited to the range of possible ambient temperatures. In further embodiments, if the sensor data is outside of the expected range, the sender node may transmit the raw data as well as an alert up to the cloud 203. This may signify to the server an error has occurred or that a potentially critical condition that requires high specificity and urgency is occurring.

In addition, assume for example the number of bits is eight, that means there are 256 value levels. If a measurement does not require a high level of accuracy for a given application, one or more of the last N bits can be truncated and removed. In this example, two of the last N bits are truncated from the original eight bit number, resulting in a six-bit binary number that can be communicated by a wireless communication device instead of eight-bits, thereby conserving the battery life of the wireless communication device.

Figure 12E:
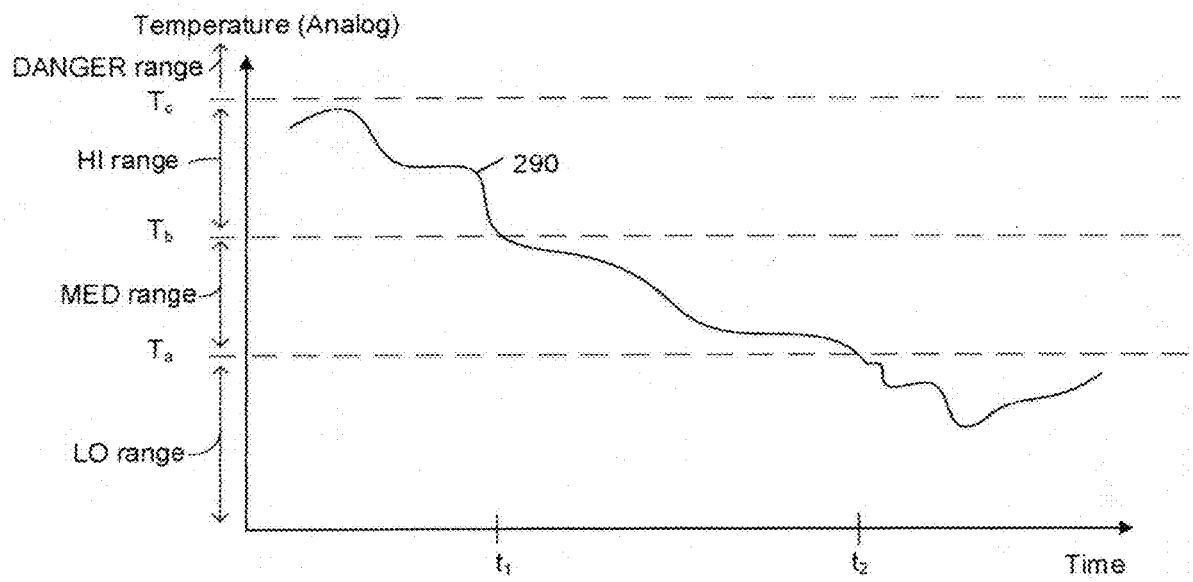
Figure 12F:
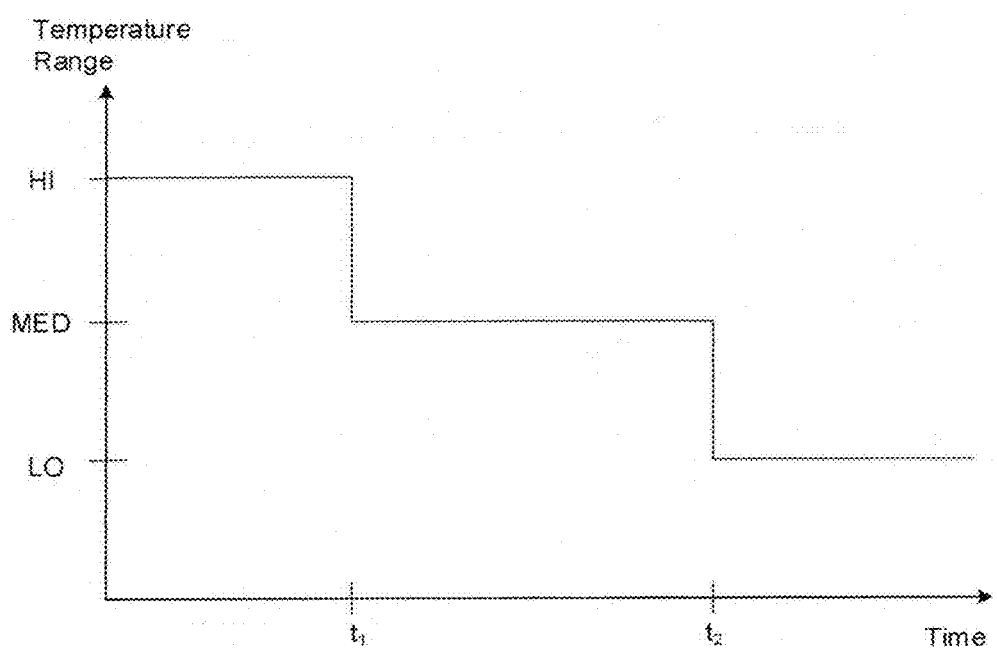

FIGS. 12E and 12F show exemplary graphs for performing dynamic compression based on ranges of data, according to some embodiments. In the example of FIGS. 12E and 12F, instead of a data value representing an analog measurement (e.g., temperature), a data value representing a range of values is transmitted from the sender node up to the cloud. FIG. 12E shows the same data curve 290 as shown in FIG. 12A, along with indicators that show four ranges for the data. In the illustrated example a HI range corresponds to temperatures between $T_c$ and $T_b$, a MED range corresponds to temperatures between $T_b$ and $T_a$, and a LO range corresponds to temperatures below $T_a$. A DANGER range includes temperatures above $T_c$. Instead of a data value representing temperature, the sender node merely transmits data values that correspond to one of the four ranges, HI, MED, and LO, according to some embodiments. Thus, the sender node may minimize the amount of data transmitted. As discussed above, a "same" signal may also be transmitted which indicates that the temperature is still within a same range as was previously transmitted. In some embodiments, when the analog sensor data is in a range of interest, the sender node switches from sending a range to sending compressed data that represents the analog measurement. In the illustrated example, if the analog temperature is in the DANGER range, the sender node switches from sending data representing the four ranges to sending compressed data that represents the exact temperature readings.

Figure 13A:
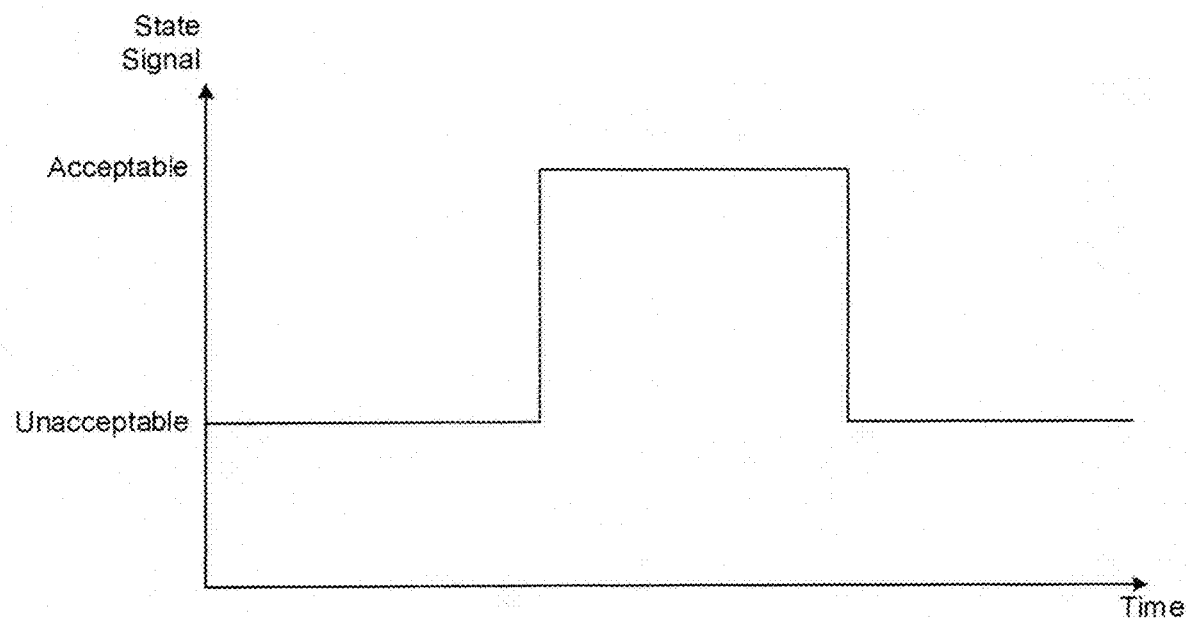
FIGS. 13A-13B shows examples of using multiple types of sensor data to selectively perform dynamic compression and reconstruction of data, according to some embodiments.
Figure 13B:
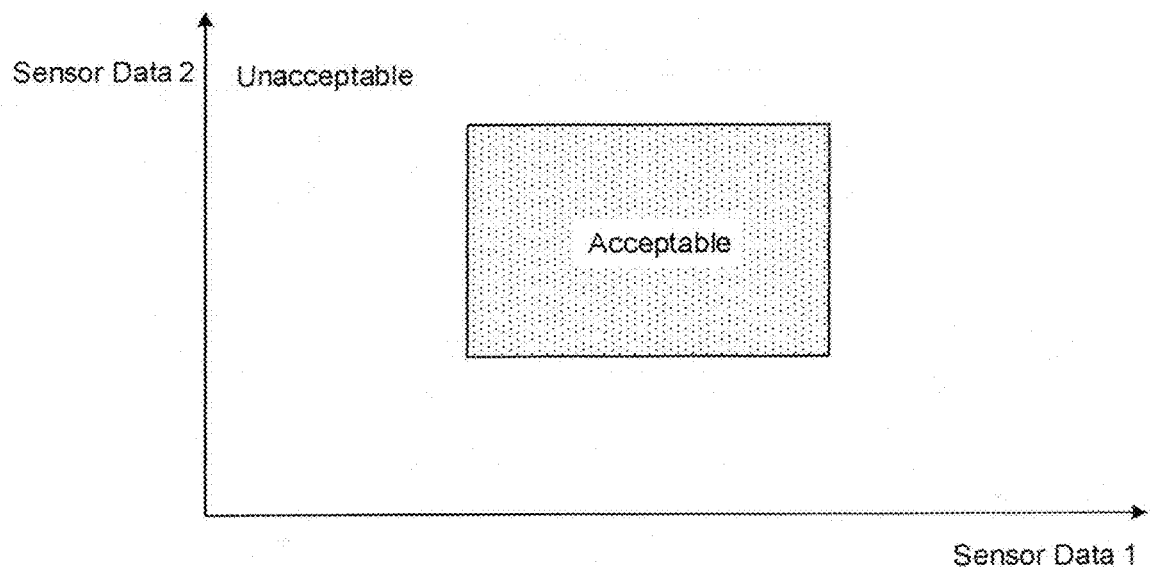

FIGS. 13A-13B shows examples of using multiple types of sensor data to selectively perform dynamic compression and reconstruction of data, according to some embodiments. In the example shown in FIG. 13A, the sender node transmits a state signal that corresponds to an acceptable state or an unacceptable state of the sensor data being collected. When the state signal for an unacceptable state is received at the server, the server may follow-up with actions to resolve the unacceptable state, according to some embodiments. The state signal may be generated based on multi-dimensional analysis of multiple sensor data that is collected by a sender node. In the example of FIG. 13B, 2-dimensional analysis is performed, but in other embodiments multi-dimensional analysis for a higher number of dimensions is performed. The range of values for the first sensor data and the second sensor data is shown by the shaded box in the center of the graph of FIG. 13B. The unacceptable ranges for the sensor data is shown by the white areas of the graph in FIG. 13B. In some embodiments, when the sensor data enters the unacceptable range, the sensor node is configured to transmit compressed digital data representing analog data measurements, in response.

In addition to run-length encoding and dynamic compression, the wireless IOT system is also configured to generate custom instructions in response to the sensor data having specific values. For example, if a temperature T is detected that's higher than 25 degrees Celsius, the sender node may issue an alert to other nodes in the wireless IOT system (e.g., a client device). For example, an artificial intelligence (AI) engine of the wireless IOT system may determine that for sensor nodes at a location that detect a high temperature measurement, at the same time a high vibration amplitude is detected, then an alert must be issued for an asset being monitored by the sensor nodes. In this case, the sensor nodes communicate the sensor data and the alert, instead of ignoring it or sending a "same" signal. In further embodiments, an interrupt signal may be sent to an operation system in response to detecting the above conditions. In other embodiments, a server anticipates an outlier signal at a given frequency. For example, it may expect to receive an outlier signal every month or every two weeks from sender nodes. If the outlier signal is not received at the correct frequency, the server issues an alert. Examples include waste drums that are being monitored by sensor nodes that store chemicals. The waste drums may have EPA regulations for the chemicals that require inspection. If the location of the waste drum is changed, the server infers that it has been inspected. Similarly, fire extinguishers may need to be inspected regularly. If someone moves the fire extinguisher, then the server knows that there is a high likelihood that it's being inspected. If the fire extinguisher or waste drum never changes location (i.e., no outlier signal is received), the server determines that no inspection took place. The server may issue an alert in response. Alternatively, a fire may be detected in a building if multiple outlier signals for the fire extinguishers are received at the same time, signaling that multiple fire extinguishers are removed at the same time. Similarly, if a first aid kit is opened and a corresponding outlier signal is sent by a sender node to the server, then the server will determine that someone in the building needs first aid, and log the event. For security applications, a status of a door (open or closed) in an area where certain people are not allowed may be tracked and outliers may be communicated to the server. Instead of using lossy compression, a sender node may be configured with the appropriate intelligence (AI engine) to decide when data and outlier data should be sent up to the cloud.

In some embodiments, the objective is to optimize space-time information entropy analysis and selection to maximize compression. Whenever there is a measurement, there is a certain amount of information entropy you really care about.

Figure 14A:
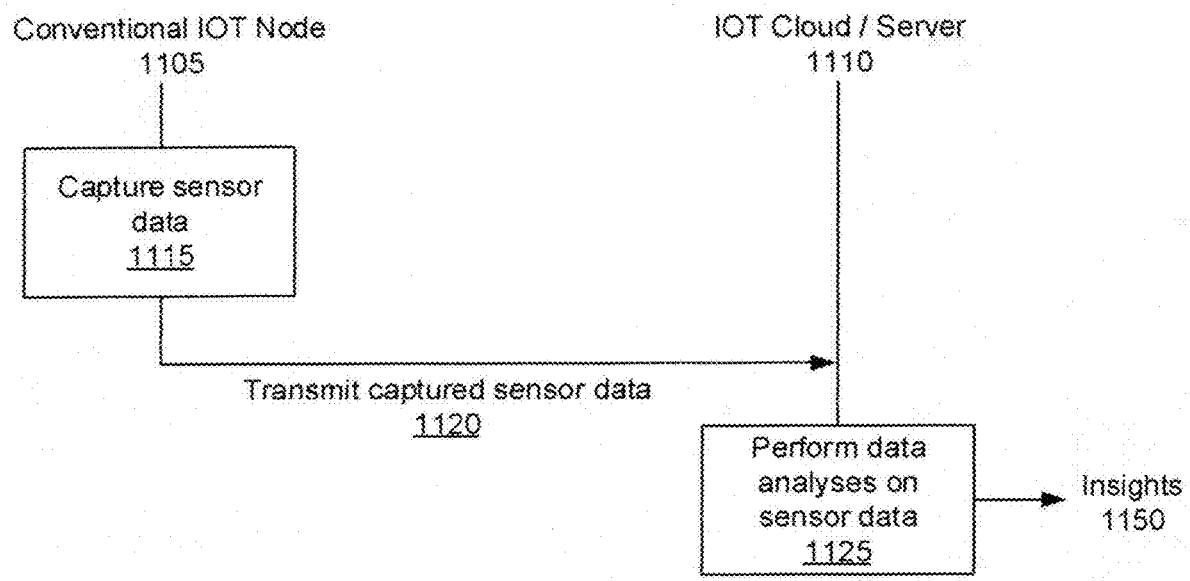
FIG. 14A shows an example interaction diagram for a conventional IOT system.

FIG. 14A shows an example interaction diagram for a conventional IOT system. In the conventional model, a sensor measurement 1115 is captured by a conventional IOT node 1105 and a relatively large amount of battery power may be consumed to send 1120 it up to the cloud 1110. Intelligence is performed in the cloud 1125 to generate insights, but not at the sensor node 1105.

Figure 14B:
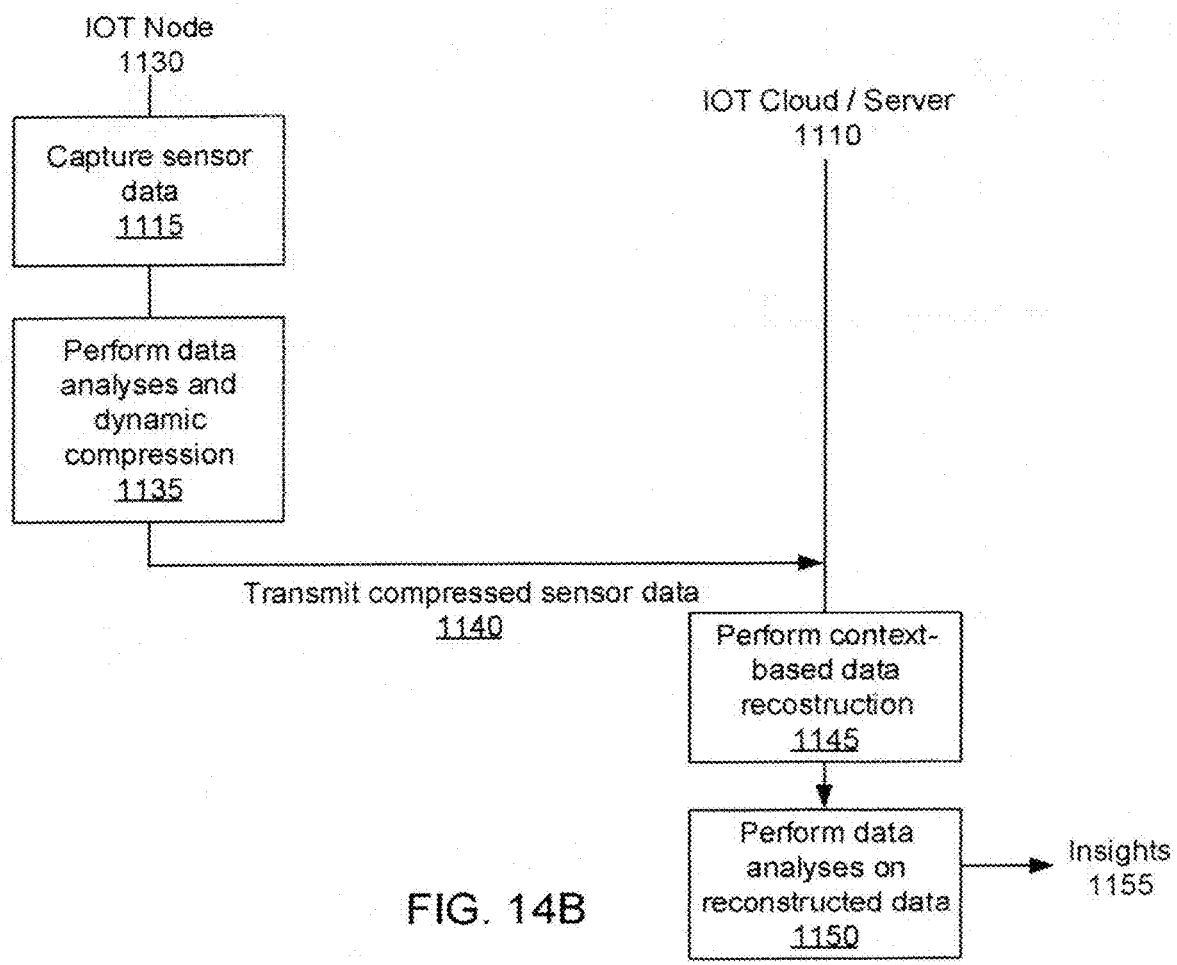
FIG. 14B shows an example interaction diagram for a disclosed IOT system using dynamic data compression and context-based reconstruction, according to some embodiments.

FIG. 14B shows an example interaction diagram for a disclosed IOT system using dynamic data compression and context-based reconstruction, according to some embodiments. In the disclosed method and system, there is a distributed information entropy analysis that includes time and space to optimize the transmission of data and conserve resource consumption in the wireless IOT network. So, when sensor data is captured 1115 by an IOT node 1130, the IOT node 1130 includes intelligence for dynamically determining how much compression to apply to the data, according to some embodiments. In some embodiments, the IOT node 1130 whether there is an outlier in the data and will only communicate the outlier to the cloud instead of all of the sensor data. In comparison to a conventional IOT system as shown in FIG. 14A, the JOT node 1130 decides whether or not the measurement is an outlier, instead of the server or cloud.

That information entropy concept is generalized in five steps:
  Step 1—Any function of time, the sender node can categorize it in time sections (e.g., different bins).
  Step 2—Instead of worrying about every outlier, the sender node can abstract away to statistical measures (e.g., min, max, std deviation, mean, etc.) Abstraction that allows reduction of data.
  Step 3—To communicate these variables, the sender node may not have to communicate every possible value if it is predetermined that some values are not relevant. The sender node uses an offset and scalar multiplication to increase specificity of the data that has values in regions of interest.
  Step 4—Once I know a region of interest, the sender node decides what resolution to measure at. The sender node may decide whether 8 bits, 16 bits, 32 bits, or another data resolution size is used.
  Step 5—Instead of always sending data, if the data is in a region with low urgency or interest, the sender node may decide only to communicate when there is a change or outlier in the data. So, when there is a transition from low to medium, the sender node transmits data representing the transition.

The final results rely on contextual reconstruction. The server may reconstruct the data based on instructions received from the sender node (e.g., offset values, references to previously transmitted values, using range representation, outlier representations). In some embodiments, the instructions are predetermined and stored on the server, without requiring the sender node to send the instructions up to the cloud. Thus, the intelligence of the server and the sender node are in sync. Lossless compression is possible using the cloud to reconstruct the data based on contextual information. An example of contextual information, a human looking at the temperature, doesn't care about precision temperature reading, just cares about low medium, high, and danger.

Figure 15:
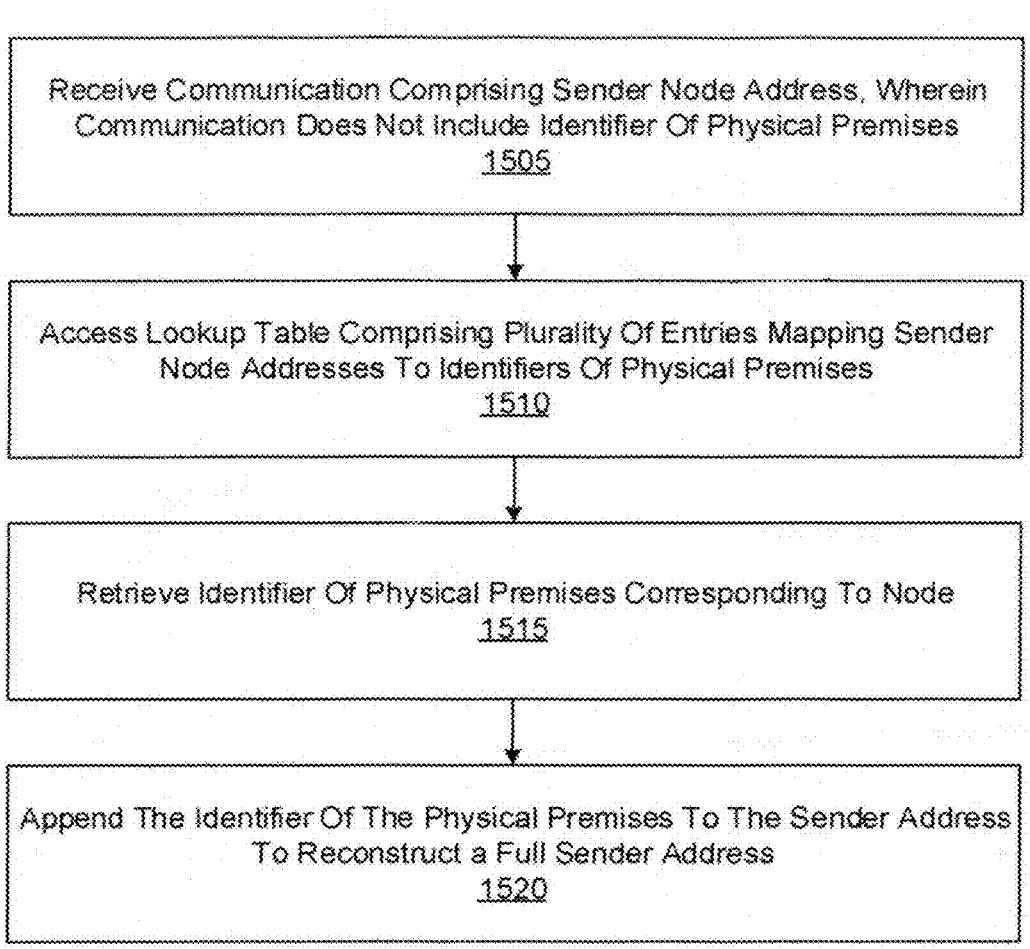
FIG. 15 is a flowchart for a method 1500 of context-based compression and reconstruction of data transmitted from a wireless node in an IOT system, according to some embodiments.

FIG. 15 is a flowchart for a method 1500 of context-based compression and reconstruction of data transmitted from a wireless node in an JOT system, according to some embodiments. The method 1500 includes a server receiving 1505 communications from a sender node. The sender node includes a full sender address which includes a sender address for the sender node and an identifier for a physical premises that is associated with the sender node. The communication includes truncated data comprising a sender node address, wherein the truncated data does not include an identifier of a physical premises associated with the sender node. The server accesses 1510 a lookup table comprising plurality of entries mapping sender node addresses to identifiers of physical premises. The server retrieves 1515 an identifier of a physical premises corresponding to node, according to the lookup table and appends 1520 the identifier of the physical premises to the sender address to reconstruct the full sender address.

Figure 16:
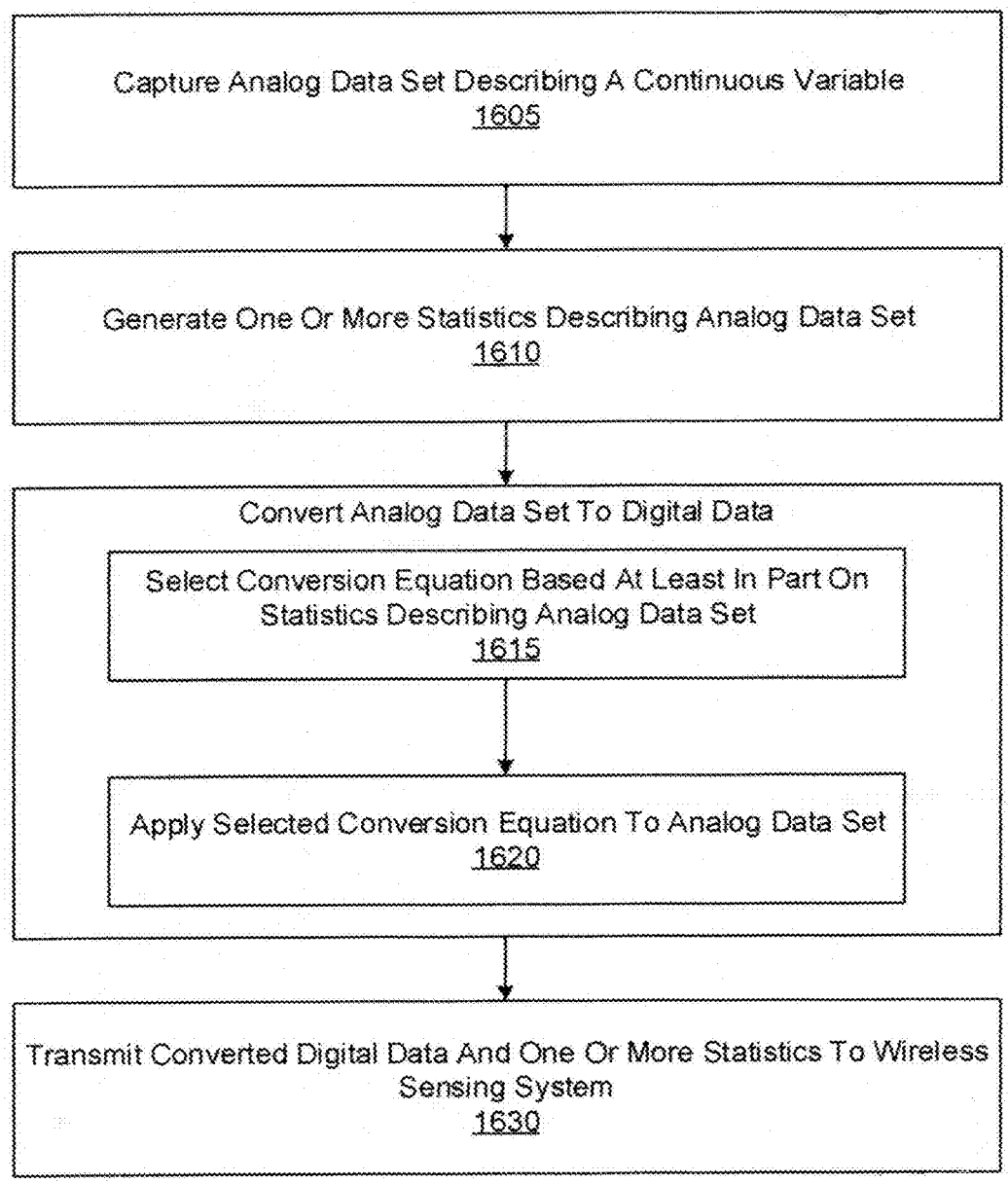
FIG. 16 is a flowchart for a method 1600 of dynamic compression of analog data collected by a wireless node for communication in an IOT system, according to some embodiments.

FIG. 16 is a flowchart for a method 1600 of dynamic compression of analog data collected by a wireless node for communication in an IOT system, according to some embodiments. The method 1600 includes capturing 1605, at a sender node, an analog data set describing a continuous variable. The sender node generates 1610 one or more statistics describing the analog data set. The sender node then converts the analog data set to digital data, using dynamic compression. The sender node selects 1615 a conversion equation based at least in part on the statistics describing the analog data set. The conversion equation may describe how the digital data represents the analog data. The conversion equation may correspond to an equation for reconstructing the analog data from the digital data, once the data is received at a server or another node of the wireless IOT system. The conversion equation may be selected based further on environmental conditions of the sender node, a known location of the sender node, a region of interest in the data, an application for the data, or some other factors, as described above with respect to FIGS. 12A-12E and 13A-13B. The sender node applies 1620 the selected conversion equation to convert the analog data set to a digital data set. The sender node then transmits 1630 converted digital data and one or more statistics to a server or another node of the wireless IOT system. The recipient of the transmitted data may then reconstruct the data using dynamic reconstruction of the data. The reconstruction may be based on the selected conversion equation. In some embodiments, the sender node transmits an identifier for the selected conversion equation along with the compressed data. In other embodiments, the recipient is configured to determine the selected conversion equation based on contextual information.

Computer Apparatus

Figure 17:
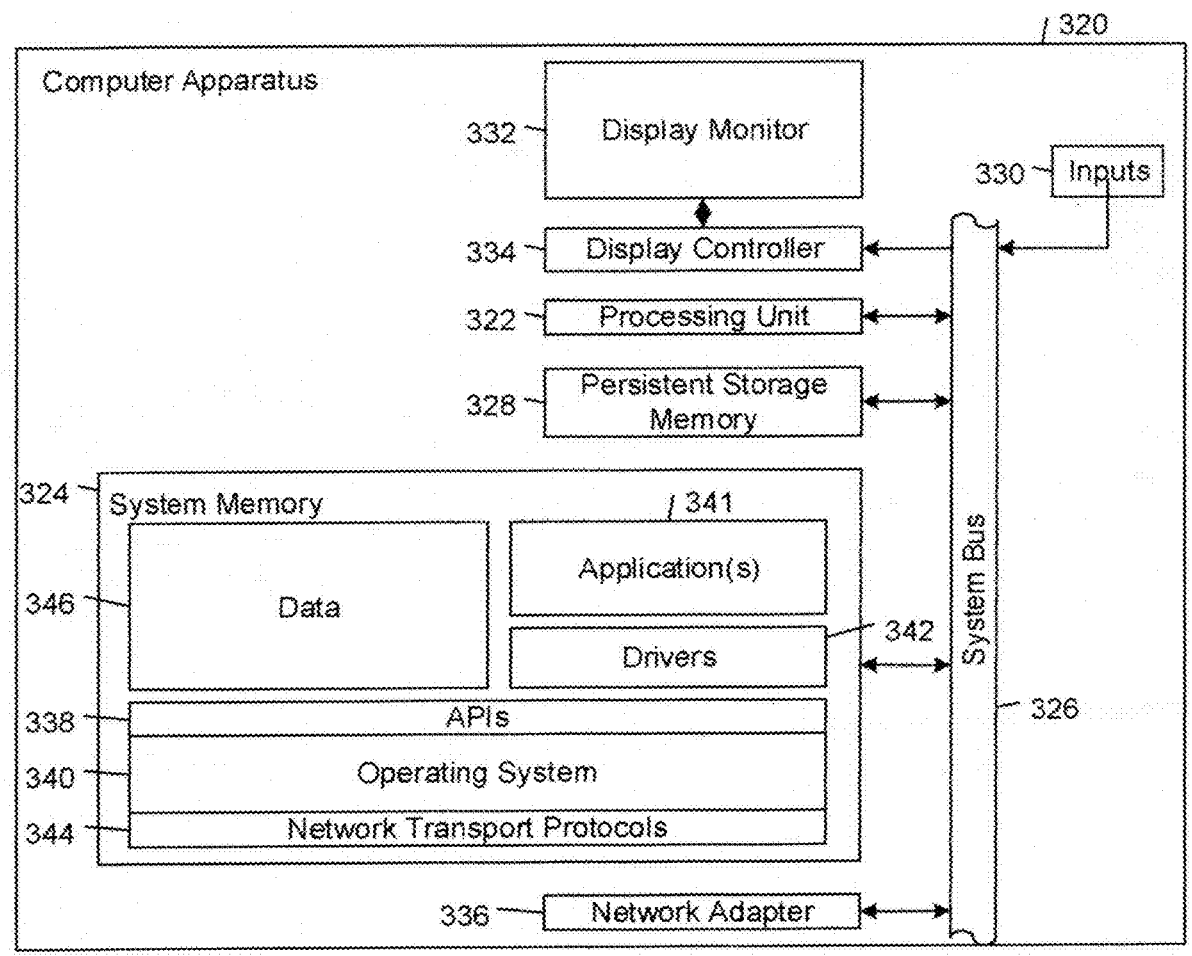
FIG. 17 shows an example embodiment of computer apparatus 320 that, either alone or in combination with one or more other computing apparatus, is operable to implement one or more of the computer systems described in this specification.

FIG. 17 shows an example embodiment of computer apparatus 320 that, either alone or in combination with one or more other computing apparatus, is operable to implement one or more of the computer systems described in this specification.

The computer apparatus 320 includes a processing unit 322, a system memory 324, and a system bus 326 that couples the processing unit 322 to the various components of the computer apparatus 320. The processing unit 322 may include one or more data processors, each of which may be in the form of any one of various commercially available computer processors. The system memory 324 includes one or more computer-readable media that typically are associated with a software application addressing space that defines the addresses that are available to software applications. The system memory 324 may include a read only memory (ROM) that stores a basic input/output system (BIOS) that contains start-up routines for the computer apparatus 320, and a random access memory (RANI). The system bus 326 may be a memory bus, a peripheral bus or a local bus, and may be compatible with any of a variety of bus protocols, including PCI, VESA, Microchannel, ISA, and EISA. The computer apparatus 320 also includes a persistent storage memory 328 (e.g., a hard drive, a floppy drive, a CD ROM drive, magnetic tape drives, flash memory devices, and digital video disks) that is connected to the system bus 326 and contains one or more computer-readable media disks that provide non-volatile or persistent storage for data, data structures and computer-executable instructions.

A user may interact (e.g., input commands or data) with the computer apparatus 320 using one or more input devices 330 (e.g. one or more keyboards, computer mice, microphones, cameras, joysticks, physical motion sensors, and touch pads). Information may be presented through a graphical user interface (GUI) that is presented to the user on a display monitor 332, which is controlled by a display controller 334. The computer apparatus 320 also may include other input/output hardware (e.g., peripheral output devices, such as speakers and a printer). The computer apparatus 320 connects to other network nodes through a network adapter 336 (also referred to as a "network interface card" or NIC).

A number of program modules may be stored in the system memory 324, including application programming interfaces 338 (APIs), an operating system (OS) 340 (e.g., the Windows® operating system available from Microsoft Corporation of Redmond, Washington U.S.A.), software applications 341 including one or more software applications programming the computer apparatus 320 to perform one or more of the steps, tasks, operations, or processes of the locationing and/or tracking systems described herein, drivers 342 (e.g., a GUI driver), network transport protocols 344, and data 346 (e.g., input data, output data, program data, a registry, and configuration settings).

Examples of the subject matter described herein, including the disclosed systems, methods, processes, functional operations, and logic flows, can be implemented in data processing apparatus (e.g., computer hardware and digital electronic circuitry) operable to perform functions by operating on input and generating output. Examples of the subject matter described herein also can be tangibly embodied in software or firmware, as one or more sets of computer instructions encoded on one or more tangible non-transitory carrier media (e.g., a machine readable storage device, substrate, or sequential access memory device) for execution by data processing apparatus.

The details of specific implementations described herein may be specific to particular embodiments of particular inventions and should not be construed as limitations on the scope of any claimed invention. For example, features that are described in connection with separate embodiments may also be incorporated into a single embodiment, and features that are described in connection with a single embodiment may also be implemented in multiple separate embodiments. In addition, the disclosure of steps, tasks, operations, or processes being performed in a particular order does not necessarily require that those steps, tasks, operations, or processes be performed in the particular order; instead, in some cases, one or more of the disclosed steps, tasks, operations, and processes may be performed in a different order or in accordance with a multi-tasking schedule or in parallel.

Other embodiments are within the scope of the claims.

Additional Configuration Information

The foregoing description of the embodiments of the disclosure have been presented for the purpose of illustration; it is not intended to be exhaustive or to limit the disclosure to the precise forms disclosed. Persons skilled in the relevant art can appreciate that many modifications and variations are possible in light of the above disclosure.

Some portions of this description describe the embodiments of the disclosure in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times, to refer to these arrangements of operations as modules, without loss of generality. The described operations and their associated modules may be embodied in software, firmware, hardware, or any combinations thereof.

Any of the steps, operations, or processes described herein may be performed or implemented with one or more hardware or software modules, alone or in combination with other devices. In one embodiment, a software module is implemented with a computer program product comprising a computer-readable medium containing computer program code, which can be executed by a computer processor for performing any or all of the steps, operations, or processes described.

Embodiments of the disclosure may also relate to an apparatus for performing the operations herein. This apparatus may be specially constructed for the required purposes, and/or it may comprise a general-purpose computing device selectively activated or reconfigured by a computer program stored in the computer. Such a computer program may be stored in a non-transitory, tangible computer readable storage medium, or any type of media suitable for storing electronic instructions, which may be coupled to a computer system bus. Furthermore, any computing systems referred to in the specification may include a single processor or may be architectures employing multiple processor designs for increased computing capability.

Embodiments of the disclosure may also relate to a product that is produced by a computing process described herein. Such a product may comprise information resulting from a computing process, where the information is stored on a non-transitory, tangible computer readable storage medium and may include any embodiment of a computer program product or other data combination described herein.

Finally, the language used in the specification has been principally selected for readability and instructional purposes, and it may not have been selected to delineate or circumscribe the inventive subject matter. It is therefore intended that the scope of the disclosure be limited not by this detailed description, but rather by any claims that issue on an application based hereon. Accordingly, the disclosure of the embodiments is intended to be illustrative, but not limiting, of the scope of the disclosure, which is set forth in the following claims.

What is claimed is:

1. A method comprising:
receiving, by a server of a wireless sensing system from a node of the wireless sensing system, a communication comprising a sender node address, wherein the communication does not include an identifier of a physical premises corresponding to the node;
accessing, by the server, a lookup table comprising a plurality of entries, each entry of the plurality of entries mapping a sender node address of a node of the wireless sensing system to identifiers of at least one respective physical premises; and
retrieving, by the server based at least in part on the received sender node address, the identifier of the physical premises corresponding to the node.

2. The method of claim 1, wherein the communication further comprises sensor data captured by the node of the wireless sensing system.

3. The method of claim 2, wherein the sensor data comprises analog data values describing one or more of: spatial position, temperature, audio files, and voltage.

4. The method of claim 3, wherein each sender node address is at least four bytes and further wherein the hash of the sender node address is one byte.

5. The method of claim 2, wherein the sensor data is characterized based at least in part on a previously transmitted data measurement.

6. The method of claim 5, wherein the statistical data sets comprise one or more of: minimum/maximum values, standard deviation values, mean values, and median values.

7. The method of claim 2, wherein the sensor data comprises one or more statistical data sets generated from analog data values captured by the node of the wireless sensing system.

8. The method of claim 1, wherein the communication comprises a hash of the sender node address and wherein retrieving the identifier of the physical premises corresponding to the node comprises using the hash to retrieve the identifier of at the physical premises corresponding to the node of the wireless sensing system.

9. The method of claim 1, wherein the lookup table is stored by a cloud of the wireless sensing system.

10. The method of claim 1, wherein the physical premises is a building in an environment of the wireless sensing system and wherein the retrieving comprises retrieving a building identifier stored in the lookup table.

11. A method comprising:
capturing, by one or more sensors of a node of a wireless sensing system, an analog data set, the analog data set describing a continuous variable;
generating, by the node of the wireless sensing system, one or more statistics describing the analog data set;
converting, by the node of the wireless sensing system, the analog data set to digital data; and
transmitting, by the node of the wireless sensing system, the converted digital data and the one or more statistics to the wireless sensing system, wherein
converting the analog data set to digital data comprises:
selecting a conversion equation based at least in part on the one or more statistics describing the analog data set, the conversion equation describing a conversion from continuous data to discrete data points, and
applying the selected conversion equation to the analog data set.

12. The method of claim 11, further comprising:
truncating one or more last end bits from the converted digital data; and
transmitting the remaining untruncated bits to the wireless sensing system.

13. The method of claim 11, wherein the conversion equation comprises a linear equation offset by a minimum value of the analog data set.

14. The method of claim 11, wherein the conversion equation comprises a range, region, or multidimensional shape corresponding to threshold values of the continuous variable.

15. The method of claim 14, wherein the threshold values of the continuous variable are specified by the wireless sensing system.

16. The method of claim 11, wherein the conversion equation comprises a Bayesian spline shape.

17. The method of claim 11, wherein selecting the conversion equation is based at least in part on a specified resolution for the digital data.

18. The method of claim 11, wherein converting the analog data set to digital data is performed dynamically and in real-time as analog data is captured by the one or more sensors of the node of the wireless sensing system.

19. A wireless sensing system comprising:
a plurality of nodes, each node of the plurality of nodes comprising at least a communications system and one or more sensors, wherein each node is configured to perform steps comprising:
 capturing, by the one or more sensors, an analog data set, the analog data set describing a continuous variable;
 generating one or more statistics describing the analog data set;
 converting the analog data set to digital data; and
 transmitting the converted digital data and the one or more statistics to a server of the wireless sensing system; and
the server comprising at least a communications system compatible to communicate with the plurality of nodes, the server configured to perform steps comprising:
 receiving the converted digital data and the one or more statistics;
 performing a data analysis on the received digital data and the one or more statistics; and
 transmitting a notification comprising at least one result of the data analysis to a user of the wireless sensing system.

* * * * *